(12) United States Patent
Kobayashi et al.

(10) Patent No.: US 9,299,867 B2
(45) Date of Patent: Mar. 29, 2016

(54) METHOD OF MANUFACTURING SOLID-STATE IMAGING APPARATUS

(71) Applicant: Sony Corporation, Tokyo (JP)

(72) Inventors: Mikiko Kobayashi, Kanagawa (JP); Sanghoon Ha, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/188,052

(22) Filed: Feb. 24, 2014

(65) Prior Publication Data

US 2014/0167124 A1   Jun. 19, 2014

Related U.S. Application Data

(62) Division of application No. 13/527,685, filed on Jun. 20, 2012, now Pat. No. 8,710,559.

(30) Foreign Application Priority Data

Jun. 28, 2011   (JP) .................. 2011-143458

(51) Int. Cl.
*H01L 27/146*   (2006.01)
*H01L 31/042*   (2014.01)
*H04N 5/361*   (2011.01)
*H01L 31/18*   (2006.01)
*H01L 31/103*   (2006.01)

(52) U.S. Cl.
CPC .......... *H01L 31/042* (2013.01); *H01L 27/1461* (2013.01); *H01L 27/1464* (2013.01); *H01L 27/14612* (2013.01); *H01L 27/14616* (2013.01); *H01L 27/14689* (2013.01); *H01L 31/103* (2013.01); *H01L 31/18* (2013.01); *H01L 31/1804* (2013.01); *H04N 5/361* (2013.01); *Y02P 70/521* (2015.11)

(58) Field of Classification Search
CPC .................. H01L 27/1461; H01L 27/14612; H01L 27/14616; H01L 27/14654; H01L 27/14656; H01L 27/14689
See application file for complete search history.

(56) References Cited

U.S. PATENT DOCUMENTS

| | | | |
|---|---|---|---|
| 7,115,924 B1 * | 10/2006 | LaMaster et al. | 257/291 |
| 2009/0166693 A1 * | 7/2009 | Kim | 257/292 |
| 2011/0032405 A1 * | 2/2011 | Nozaki et al. | 348/308 |
| 2011/0298078 A1 * | 12/2011 | Ha et al. | 257/443 |

* cited by examiner

Primary Examiner — Yu Chen
(74) Attorney, Agent, or Firm — Sheridan Ross P.C.

(57) ABSTRACT

A solid-state imaging apparatus includes a transfer gate electrode formed on a semiconductor substrate; a photoelectric conversion unit including an electric charge storage area that is formed from a surface side of the semiconductor substrate in a depth direction, a transfer auxiliary area formed of a second conductive type impurity area that is formed in such a manner as to partially overlap the transfer gate electrode, and a dark current suppression area that is a first dark current suppression area formed in an upper layer of the transfer auxiliary and formed so as to have positional alignment in such a manner that the end portion of the transfer auxiliary area on the transfer gate electrode side is at the same position as the end portion of the transfer auxiliary area; and a signal processing circuit configured to process an output signal output from the solid-state imaging apparatus.

6 Claims, 15 Drawing Sheets

METHOD OF MANUFACTURING SOLID-STATE IMAGING APPARATUS

CROSS-REFERENCE TO RELATED APPLICATIONS

This application is a division of U.S. patent application Ser. No. 13/527,685, filed Jun. 20, 2012, which claims priority to Japanese Patent Application Serial No. JP 2011-143458, filed in the Japan Patent Office on Jun. 28, 2011, the entire contents of which are hereby incorporated herein by reference.

BACKGROUND

The present disclosure relates to a solid-state imaging apparatus, a method of manufacturing the solid-state imaging apparatus, and an electronic apparatus.

Hitherto, examples of solid-state imaging apparatuses used for digital cameras, video cameras, and the like include CCD-type solid-state imaging apparatuses and CMOS-type solid-state imaging apparatuses. In these solid-state imaging apparatuses, a light-receiving unit is formed for each of a plurality of pixels that are formed in a two-dimensional matrix, and in this light-receiving unit, signal electric charge is generated in correspondence with the amount of received light. Then, the signal electric charge generated in the light-receiving unit is transferred and amplified, thereby obtaining an image signal.

In solid-state imaging apparatuses, in order that processing variations at the time of the formation of photodiodes are reduced so as to prevent transfer efficiency resulting from the processing variations from being reduced, a method in which photodiodes are formed by self-alignment is adopted. In addition, in order to improve transfer efficiency, in the disclosures described in Japanese Unexamined Patent Application Publication Nos. 11-126893 and 2008-66480, and Japanese Unexamined Patent Application Publication (Translation of PCT Application) No. 2009-518850, a method has been proposed in which an electric charge storage area forming a photodiode is formed so as to be superposed directly below the transfer gate electrode.

Furthermore, in photodiodes, in order for dark current to be suppressed, it is common practice to form a semiconductor area of a conductive type opposite to that of an electric charge storage layer on the surface of a semiconductor substrate. In order to increase the pinning effect in a semiconductor area for suppressing dark current, in the disclosure described in Japanese Unexamined Patent Application Publication (Translation of PCT Application) No. 2009-518850, a configuration in which a semiconductor area (for example, p-type semiconductor area) for pinning is superposed directly below a transfer gate electrode has been proposed.

The configuration in which the electric charge storage layer and the semiconductor area for suppressing dark current are arranged so as to overlap the transfer gate electrode has advantages and disadvantages. Depending on the case, it may be difficult to implement configurations that satisfy all of the formation of photodiodes, securing of pinning below a transfer gate electrode, and securing of a transfer margin. For example, a dopant that is implanted for securing pinning acts in a direction that obstructs the transfer of signal electric charge, and a dopant that is ion-implanted for securing a transfer margin acts in a direction that weakens pinning below a transfer gate electrode.

As described above, in the configuration of the solid-state imaging apparatus of the related art, there is a trade-off relationship between securing of pinning for dark current suppression and securing of a transfer margin, and design of this area around a transfer gate electrode is difficult.

SUMMARY

In view of the above-described points, the present disclosure provides a solid-state imaging apparatus in which transfer efficiency has been improved while suppressing generation of dark current. Furthermore, the present disclosure provides an electronic apparatus using a solid-state imaging apparatus.

A solid-state imaging apparatus of the present disclosure is configured to include a transfer gate electrode, and a photoelectric conversion unit formed of an electric charge storage area, a transfer auxiliary area, and a first dark current suppression area. The transfer gate electrode is formed on the semiconductor substrate. The electric charge storage area is formed from a surface side of the semiconductor substrate in a depth direction and is formed so as to partially overlap the transfer gate electrode. Furthermore, the electric charge storage area is formed of a first conductive type impurity area. The transfer auxiliary area is formed in an upper layer of the electric charge storage area and is formed so as to partially overlap the transfer gate electrode. The transfer auxiliary area is formed of a second conductive type impurity area. The first dark current suppression area is formed in an upper layer of the transfer auxiliary area in such a way that the end portion on the transfer gate electrode side has positional alignment so as to be at the same position as that of the end portion of the transfer auxiliary area. Furthermore, the first dark current suppression area is formed of an impurity area of a conductive type the same as that of the transfer auxiliary area, and is formed of an impurity area at a concentration higher than that of the transfer auxiliary area.

In the solid-state imaging apparatus of the present disclosure, the first dark current suppression area acts to suppress dark current that is generated in the interface of the semiconductor substrate. Furthermore, the transfer auxiliary area, which is formed at a concentration lower than that of the impurity concentration of the first dark current suppression area and is formed in a layer under the first dark current suppression area, acts to improve the transfer efficiency of the signal electric charge stored in the electric charge storage area.

A method of manufacturing a solid-state imaging apparatus according to the present disclosure includes forming an electric charge storage area by ion-implanting a first conductive type impurity from a surface side of a semiconductor substrate in a depth direction. The method further includes forming a transfer auxiliary area by ion-implanting a second conductive type impurity into an upper layer of the electric charge storage area. The method further includes forming a first dark current suppression area through a mask used when the transfer auxiliary area is formed by ion-implanting the second conductive type impurity at a concentration higher than that of the transfer auxiliary area into the upper layer of the transfer auxiliary area. In these steps, a photoelectric conversion unit is formed. Then, the method includes forming a transfer gate electrode in an area that partially overlaps the electric charge storage area, the transfer auxiliary area, and the first dark current suppression area in the upper area of the semiconductor substrate.

In the method of manufacturing a solid-state imaging apparatus according to the present disclosure, since the first dark current suppression area and the transfer auxiliary area are formed by using the same mask, the end portions of them are positioned in the area below the transfer gate electrode. As a result, processing variations in the formation of the first dark current suppression area and the transfer auxiliary area are reduced.

An electronic apparatus of the present disclosure includes an optical lens, the above-mentioned solid-state imaging apparatus, and a signal processing circuit. In the solid-state imaging apparatus, light that is collected by the optical lens enters. The signal processing circuit processes an output signal output from the solid-state imaging apparatus.

In the electronic apparatus of the present disclosure, in the solid-state imaging apparatus, the first dark current suppression area acts so as to suppress dark current that is generated in the interface of the semiconductor substrate. Furthermore, the transfer auxiliary area, which is formed at a concentration lower than that of the impurity concentration of a first dark current suppression area and which is formed in the under layer of the first dark current suppression area, acts so as to improve the transfer efficiency of the signal electric charge stored in the electric charge storage area. As a result, in the solid-state imaging apparatus, since improvement in the transfer efficiency and advantages of dark current suppression can be obtained, the image quality is improved.

According to the present disclosure, in the solid-state imaging apparatus, transfer efficiency can be improved while suppressing generation of dark current. Furthermore, by using the solid-state imaging apparatus, an electronic apparatus in which image quality has been improved is obtained.

DETAILED DESCRIPTION OF EMBODIMENTS

Figure 1:
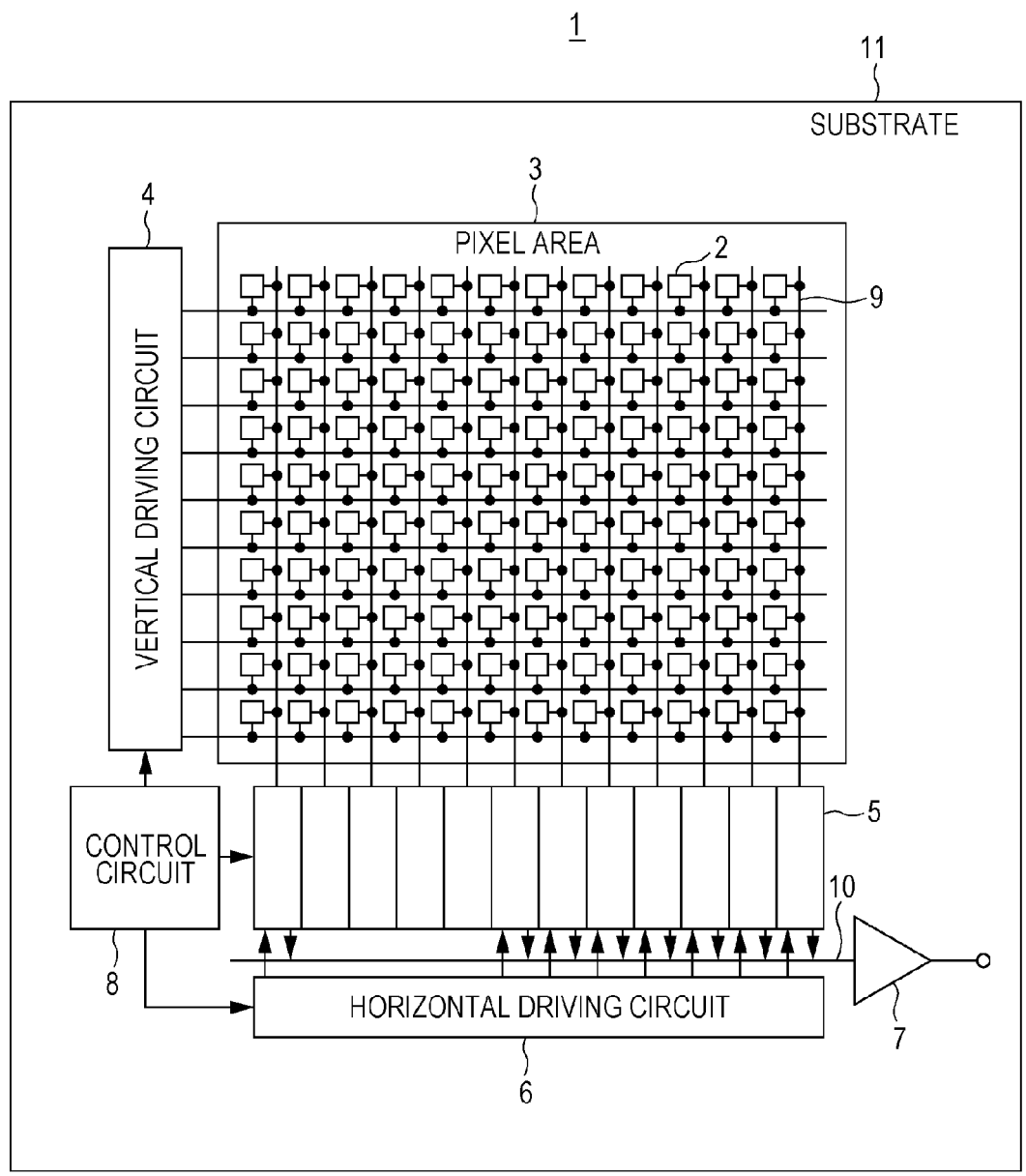
FIG. 1 illustrates an overall configuration of a solid-state imaging apparatus according to a first embodiment of the present disclosure.

Examples of a solid-state imaging apparatus, a method of manufacturing the solid-state imaging apparatus, and an electronic apparatus according to embodiments of the present disclosure will be described below with reference to FIGS. 1 to 18. The embodiments of the present disclosure will be described in the following order. The present disclosure is not limited to the examples described below.
1. First Embodiment: Solid-State Imaging Apparatus
   1-1 Overall configuration of solid-state imaging apparatus
   1-2 Configuration of main portion
   1-3 Manufacturing method
2. Second Embodiment: Solid-State Imaging Apparatus
   2-1 Configuration of main portion
   2-2 Manufacturing method
3. Third Embodiment: Solid-State Imaging Apparatus
   3-1 Configuration of main portion
   3-2 Manufacturing method
4. Fourth Embodiment: Solid-State Imaging Apparatus
   4-1 Configuration of main portion
   4-2 Manufacturing method
5. Fifth Embodiment: Reverse-Surface-Irradiation-Type Solid-State Imaging Apparatus
6. Sixth Embodiment: Electronic Apparatus
1. First Embodiment: Solid-State Imaging Apparatus
   1-1 Overall Configuration of Solid-state Imaging Apparatus FIG. 1 is a schematic block diagram illustrating the whole of a CMOS-type solid-state imaging apparatus according to a first embodiment of the present disclosure.

A solid-state imaging apparatus 1 of the present exemplary embodiment is configured to include a pixel area 3 formed of a plurality of pixels 2 that are arranged on a substrate 11 formed from silicon, a vertical driving circuit 4, a column signal processing circuit 5, a horizontal driving circuit 6, an output circuit 7, a control circuit 8, and the like.

The pixel 2 is formed of a photoelectric conversion unit made of a photodiode, and a plurality of pixel transistors, with a plurality of them being arranged regularly in the form of a two-dimensional array on the substrate 11. The pixel transistors forming the pixels 2 may be four MOS transistors including a transfer transistor, a reset transistor, a selection transistor, and an amplifier transistor, and may also be three transistors, excluding the selection transistor.

The pixel area 3 is formed by a plurality of pixels 2, which are arranged regularly in a two-dimensional array form. The pixel area 3 is formed of an effective pixel area in which light is actually received, and signal electric charge generated by photoelectric conversion is amplified and is read into the column signal processing circuit 5, and a black reference pixel area (not shown) for outputting optical black serving as a reference for black level. The black reference pixel area is usually formed in the outer peripheral portion of the effective pixel area.

On the basis of a vertical synchronization signal, a horizontal synchronization signal, and a master clock, the control circuit 8 generates a clock signal and a control signal, which serve as a reference for operation of the vertical driving circuit 4, the column signal processing circuit 5, the horizontal driving circuit 6, and the like. Then, the clock signal, the control signal, and the like, which are generated by the control circuit 8, are input to the vertical driving circuit 4, the column signal processing circuit 5, the horizontal driving circuit 6, and the like.

The vertical driving circuit 4 is formed by, for example, a shift register, and selectively sequentially scans each pixel 2 of the pixel area 3 in units of rows in the vertical direction. Then, the vertical driving circuit 4 supplies, to the column signal processing circuit 5 through the vertical signal line, a pixel signal based on the signal electric charge that is generated on the basis of the amount of received light in the photodiode of each pixel 2.

The column signal processing circuit 5, which is arranged, for example, for each column of the pixels 2, performs signal processing, such as noise reduction and signal amplification, on signals output from the pixels 2 for one row on the basis of a signal from a black reference pixel area (although not shown in the figure, formed in the surroundings of the effective pixel area) for each pixel column. In the output stage of the column signal processing circuit 5, a horizontal selection switch (not shown) is provided in the space with the horizontal signal line 10.

The horizontal driving circuit 6, which is formed of, for example, a shift register, sequentially outputs horizontal scanning pulses, thereby sequentially selects the column signal processing circuits 5, and outputs a pixel signal from each of the column signal processing circuits 5 to the horizontal signal line 10.

The output circuit 7 performs signal processing on the signal that is sequentially supplied from each of the column signal processing circuits 5 through the horizontal signal line 10, and outputs the signal.

1-2 Configuration of Main Portion

Figure 2:
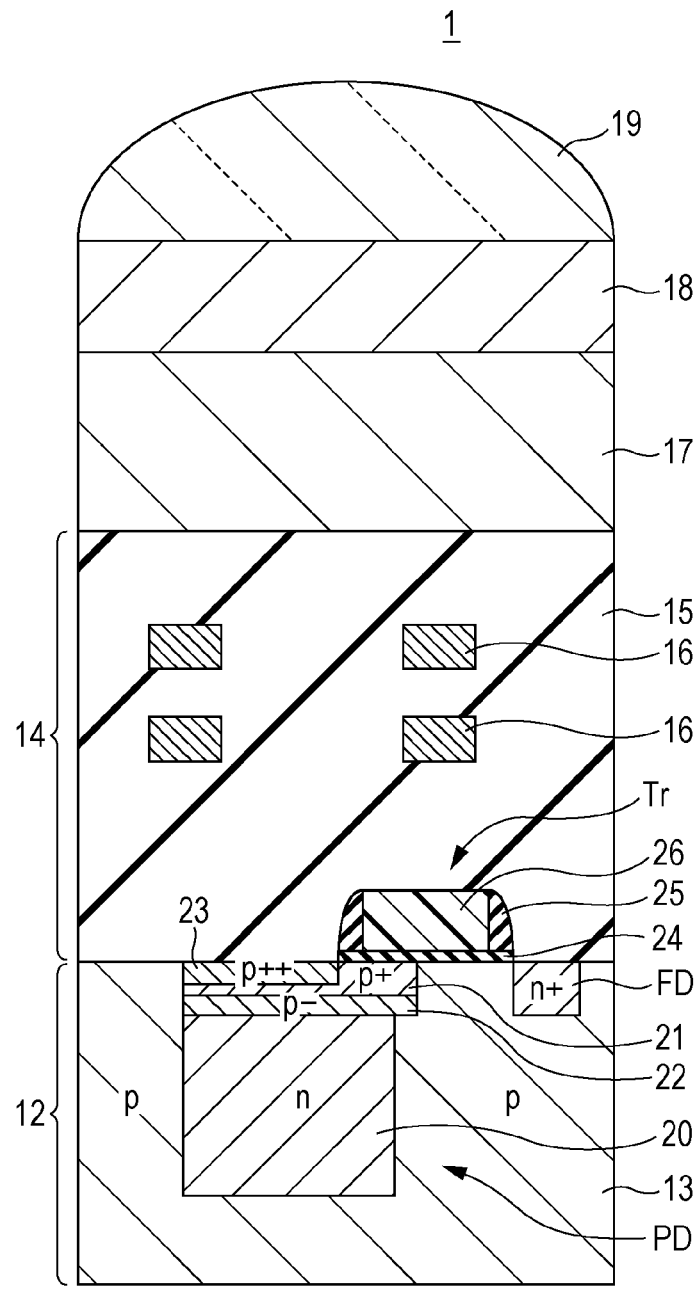
FIG. 2 illustrates the cross-sectional configuration of the main portion of the solid-state imaging apparatus according to the first embodiment of the present disclosure.

FIG. 2 illustrates the cross-sectional configuration of the main portion of the solid-state imaging apparatus 1 according to the present exemplary embodiment. In FIG. 2, the cross-sectional structure of one pixel in the pixel area is shown.

The solid-state imaging apparatus 1 of the present exemplary embodiment is configured to include a substrate 12 on which pixels formed of photodiodes PDs that are photoelectric conversion units are formed, a wiring layer 14, a color filter layer 17, and an on-chip lens 19, which are formed in sequence on the substrate 12.

The substrate 12 is formed by, for example, a first-conductive-type (for example, n-type) semiconductor substrate, and the area in which pixels are formed is made to be a semiconductor well layer 13 formed of a second-conductive-type (for example, p-type) impurity area, as shown in FIG. 2. The p-type semiconductor well layer 13 is formed by, for example, ion implantation. On the surface side of the substrate 12, pixels including photodiodes PD forming photoelectric conversion units, and transfer transistors Tr serving as reading units for reading signal electric charge generated by the photodiodes PD are formed in a two-dimensional matrix manner.

The photodiode PD, which is formed on the surface of the substrate 12, has a dark current suppression area (hereinafter, first dark current suppression area 21), which is formed in an overlapping manner under the transfer gate electrode 26 (to be described later), and an outermost surface dark current suppression area (hereinafter, a second dark current suppression area 23). The photodiode PD further includes a transfer auxiliary area 22 formed in the layer under the first dark current suppression area 21 and the second dark current suppression area 23, and an electric charge storage area 20 formed in the layer under the transfer auxiliary area 22.

The first dark current suppression area 21 is formed on the surface side of the substrate 12 in the area where the photodiode PD is formed, with the end portion thereof being formed so as to be superposed directly below the transfer gate electrode 26 (to be described later). Furthermore, the first dark current suppression area is formed of a p-type semiconductor area (p+), and the impurity concentration of the first dark current suppression area 21 is set at, for example, $1\times10^{16}$ to $1\times10^{17}$ (atoms/cm$^3$).

The second dark current suppression area 23, which is on the first dark current suppression area 21, is formed on the outermost surface of the substrate 12 excluding the upper layer of the first dark current suppression area 21 positioned below the transfer gate electrode 26, and is formed at a position that is not superposed directly below the transfer gate electrode 26. Furthermore, the second dark current suppression area 23 is formed of a p-type semiconductor area (p++) at a concentration higher than that of the p-type semiconductor area (p+) forming the first dark current suppression area 21, and the impurity concentration of the second dark current suppression area 23 is set at, for example, $1\times10^{18}$ to $1\times10^{19}$ (atoms/cm$^3$).

The first dark current suppression area 21 is formed by ion implantation earlier than the second dark current suppression area 23, and the second dark current suppression area 23 is formed by ion implantation after the transfer gate electrode 26 has been formed (to be described later). The outermost surface below the transfer gate electrode 26 is made to be the first dark current suppression area 21, and the outermost surface of the photodiode PD other than that is made to be the second dark current suppression area 23.

In the present exemplary embodiment, the first dark current suppression area 21 and the second dark current suppression area 23 are formed. Consequently, electrons that cause dark current, such as electrons resulting from the interface level of the light-receiving surface of the substrate 12, are pinned by holes that are majority carriers of the p-type semiconductor area. As a result, dark current is suppressed. Furthermore, since the first dark current suppression area 21 is formed so as to be superposed directly below the transfer gate electrode 26, it is possible to also suppress dark current below the transfer gate electrode 26. In addition, in the present exemplary embodiment, pinning on the outermost surface of the substrate 12 is enhanced by the second dark current suppression area 23 formed from the p-type semiconductor area (p++) at a high concentration, so that dark current can be further suppressed.

The transfer auxiliary area 22 is formed of a p-type semiconductor area (p+) at a concentration lower than that of a p-type semiconductor area (p−) forming the first dark current suppression area 21, and the impurity concentration thereof is set at $1\times10^{16}$ to $1\times10^{17}$ (atoms/cm$^3$). This transfer auxiliary area 22 is also formed so as to partially overlap below the transfer gate electrode 26 (to be described later).

The electric charge storage area 20 is formed of an n-type semiconductor area formed up to a desired depth of the substrate 12 in contact with the transfer auxiliary area 22, and the impurity concentration thereof is set at $1\times10^{17}$ to $1\times10^{18}$ (atoms/cm$^3$). This electric charge storage area 20 is also formed so as to overlap below the transfer gate electrode 26 (to be described later).

The second dark current suppression area 23 is formed in such a manner that an impurity is ion-implanted at a position shallower than the depth at which the first dark current suppression area 21 is formed. For this reason, the configuration is formed in such a way that the first dark current suppression area 21 formed from a p-type semiconductor area (p+) having a concentration intermediate between them is present between the second dark current suppression area 23 formed from the p-type semiconductor area (p++) at a high concentration and the transfer auxiliary area 22 formed from a p-type semiconductor area (p−) at a low concentration. As described above, the photodiode PD is formed by p++, p+, p−, and n, which are formed in sequence from the surface side of the substrate 12.

Furthermore, in the present exemplary embodiment, the end portions of the first dark current suppression area 21 and the transfer auxiliary area 22 below the transfer gate electrode 26 are arranged at the same positions, and the amount of overlap below the transfer gate electrode 26, that is, the amounts by which these areas overlap the transfer gate electrode 26, are made the same. Furthermore, the amount of overlap between the first dark current suppression area 21 and the transfer auxiliary area 22 is made to be larger on the side of the floating diffusion area FD (to be described later) than the overlap amount 10 below the transfer gate electrode 26 of the electric charge storage area 20.

In this photodiode PD, signal electric charge corresponding to the amount of light that enters from the light-receiving surface side is generated and is stored in the electric charge storage area 20 formed from the n-type semiconductor area.

The transfer transistor Tr is configured to include the transfer gate electrode 26 formed on the substrate 12, and a reading area (hereinafter, a floating diffusion area FD) from which signal electric charge transferred from the photodiode PD is read. The transfer gate electrode 26 is formed on the substrate 12 with a gate insulating film 24 formed from, for example, a silicon-oxide film, in between, and as described above, a portion thereof is formed in such a manner as to overlap the upper area of the first dark current suppression area 21 at the end portion of the photodiode PD. The transfer gate electrode 26 is formed of, for example, polysilicon, and the side surface of the transfer gate electrode 26 is formed with a side wall 25 formed from, for example, a silicon-nitride film. Here, the second dark current suppression area 23 is formed so as to overlap below the side wall 25 formed on the side surface on the photodiode PD side of the transfer gate electrode 26, and is formed up to a position corresponding to the end portion of the transfer gate electrode 26.

The floating diffusion area FD is formed on the surface of the substrate 12 adjacent to the photodiode PD with the transfer gate electrode 26 in between, and is formed by, for example, an n-type semiconductor area (n+) having an impurity at a concentration higher than that of the n-type semiconductor area (n) forming the electric charge storage area 20. Furthermore, in the present exemplary embodiment, the floating diffusion area FD, as will be described later, is formed by ion implantation after the side wall 25 is formed in a self-aligned manner.

In the transfer transistor Tr, by applying a desired transfer voltage to the transfer gate electrode 26, the signal electric charge stored in the electric charge storage area 20 of the photodiode PD passes through the channel part below the transfer gate electrode 26 and is transferred to the floating diffusion area FD.

On the surface of the substrate 12, in addition to the transfer transistor Tr, a desired pixel transistor, such as a reset transistor, an amplifier transistor, or a selection transistor, is formed for each pixel. In FIG. 2, the illustration thereof is omitted. Furthermore, each pixel formed of a plurality of pixel transistors including the photodiode PD and the transfer transistor Tr is structured so as to be electrically separated by the p-type semiconductor well layer 13 formed on the surface side of the substrate 12. Although the illustration is omitted in FIG. 2, the configuration may be formed in such a way that a pixel separation area formed of a p-type semiconductor area having an impurity concentration higher than the impurity concentration of the semiconductor well layer 13 is formed so as to define and separate each pixel.

The wiring layer 14 is configured to include wiring 16 in a plurality of layers (in FIG. 2, two layers) with an interlayer insulating film 15 in between on the surface of the substrate 12. The interlayer insulating film 15 is formed of, for example, a silicon-oxide film, and each wiring 16 is formed of, for example, aluminum, copper, or the like. Since the present exemplary embodiment is configured in such a manner that the solid-state imaging apparatus is a surface-irradiation-type solid-state imaging apparatus formed on the light-receiving surface side of the substrate 12, the wiring of the wiring layer 14 is formed so that the photodiode PD is opened. The wiring 16 of the wiring layer 14 is connected to, for example, the pixel transistor forming the pixel through a contact part (not shown).

The color filter layer 17 is formed on the wiring layer 14, and for each pixel, is composed of materials through which light, such as green, red, blue, cyan, yellow, or black color, is selectively passed. Alternatively, the color filter layer 17 may be formed of a material through which all light, like white color, is passed and an infrared region is not transmitted. The color filter layer 17 through which different colors are passed for each pixel may be used, or the color filter layer 17 through which the same color is transmitted in all the pixels, may be used. In the color filter layer 17, the combination of colors that are allowed to pass therethrough can be selected variously depending on the specification thereof.

The on-chip lens 19 is formed of, for example, an organic material having a desired index of refraction, and is formed on the color filter layer 17 with a planarization film 18 in between. The light that enters the solid-state imaging apparatus 1 is collected by the on-chip lens 19 and is efficiently entered into the photodiode PD of each pixel.

1-3 Manufacturing Method

Figure 3A:
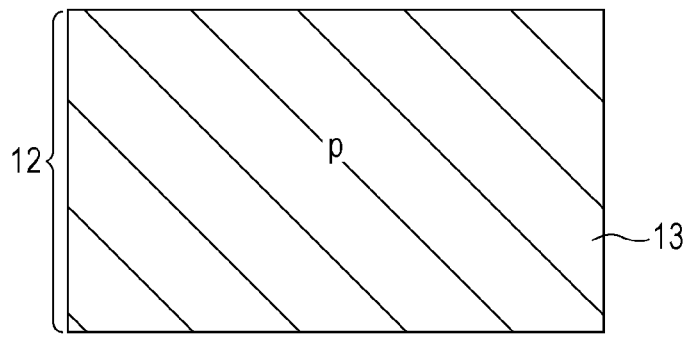
FIGS. 3A, 3B, and 3C are process charts (No. 1) illustrating a method of manufacturing the solid-state imaging apparatus according to the first embodiment of the present disclosure.

Next, a description will be given of a method of manufacturing a solid-state imaging apparatus according to the present exemplary embodiment. FIG. 3A through to FIG. 5H are process charts illustrating a method of manufacturing the solid-state imaging apparatus 1 according to the present exemplary embodiment.

First, as shown in FIG. 3A, by ion-implanting a p-type impurity on the surface that serves as the pixel formation area of the substrate 12, a p-type semiconductor well layer 13 is formed.

Figure 3B:
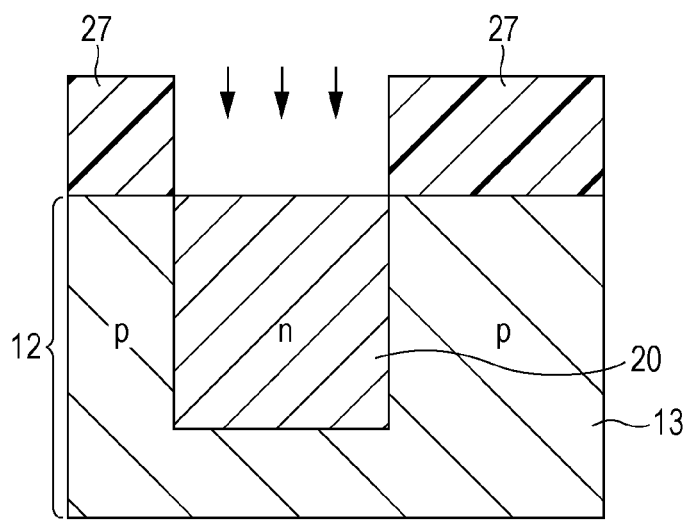

Next, as shown in FIG. 3B, a photo resist mask 27 whose area in which the photodiode PD of each pixel is formed is formed on the substrate 12. After that, by ion-implanting an n-type impurity with the photo resist mask 27 in between, an electric charge storage area 20 formed of an n-type semiconductor area, which is formed from the surface side of the substrate 12 to the desired depth, is formed.

Figure 3C:
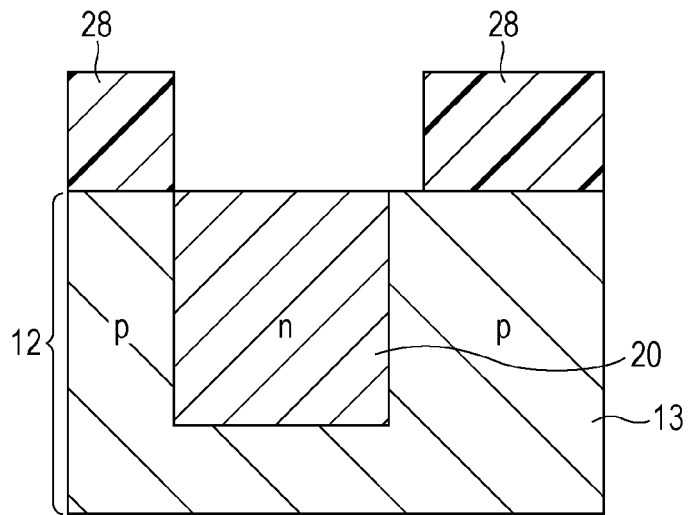

Next, the photo resist mask 27 used for forming the electric charge storage area 20 is removed, and as shown in FIG. 3C, a new photo resist mask 28 is formed. Here, in the photo resist mask 28, a portion in which the electric charge storage area 20 has been formed is opened and also the opening is expanded on the side in which the transfer gate electrode 26 is formed. That is, a photo resist mask 28 having a larger opening is formed toward the transfer gate electrode 26 side more than the area where the electric charge storage area 20 has been formed.

Figure 4D:
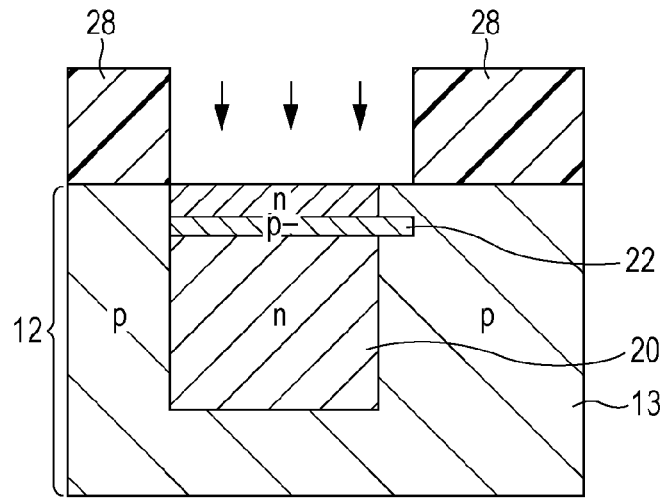
FIGS. 4D, 4E, and 4F are process charts (No. 2) illustrating a method of manufacturing the solid-state imaging apparatus according to the first embodiment of the present disclosure.

Next, as shown in FIG. 4D, by ion-implanting a p-type impurity with the photo resist mask 28 in between, a transfer auxiliary area 22 formed of a p-type semiconductor area (p−) is formed at a depth apart by a desired distance from the surface of the substrate 12. The transfer auxiliary area 22 is formed in the range of, for example, 20 to 40 nm from the surface of the substrate 12.

Figure 4E:
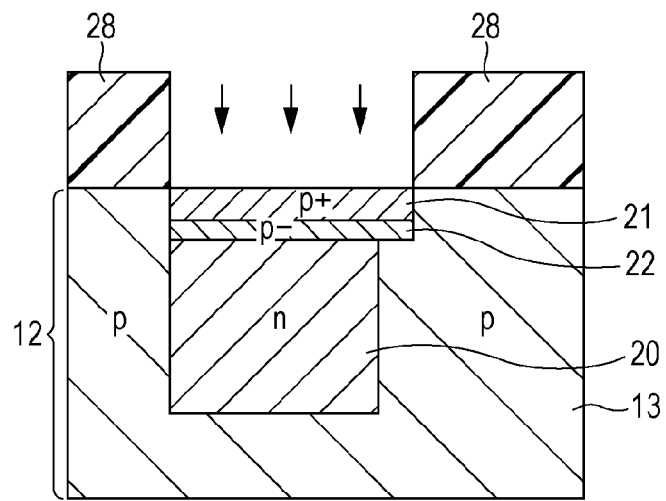

Next, as shown in FIG. 4E, by further ion-implanting a p-type impurity with the photo resist mask 28 used for forming the transfer auxiliary area 22 in between, a first dark current suppression area 21 formed of a p-type semiconductor area (p+) is formed from the surface of the substrate 12 up to a depth in contact with the transfer auxiliary area 22. Here, by forming the first dark current suppression area 21 at a dosage higher than the dosage of the transfer auxiliary area 22, the first dark current suppression area 21 having a concentration higher than the impurity concentration of the transfer auxiliary area 22 is formed.

In the present exemplary embodiment, when the transfer auxiliary area 22 and the first dark current suppression area 21 are to be formed, as shown in FIGS. 3C to 4E, a photo resist mask 28 having an opening larger than that of the photo resist mask 27 at the time of the formation of the electric charge storage area 20 is used. As a result, it is possible to form the first dark current suppression area 21 and the transfer auxiliary area 22 which project more to the side where the transfer gate electrode 26 is formed than the electric charge storage area 20.

Figure 4F:
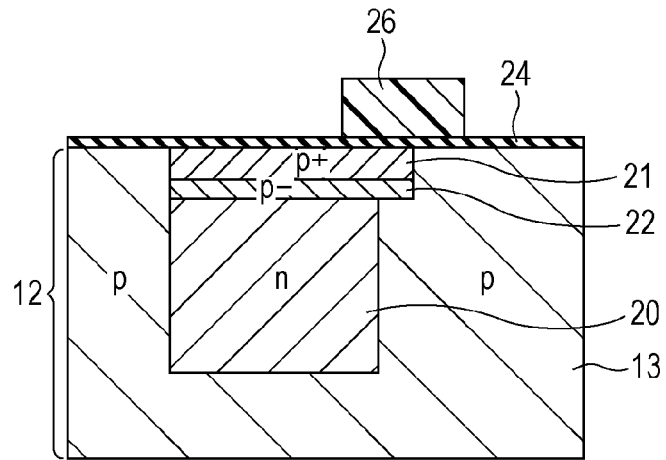

Next, the photo resist mask 28 is removed, and as shown in FIG. 4F, the transfer gate electrode 26 is formed with the gate insulating film 24 in between. After an electrode layer formed of polysilicon is formed on the entire surface of the substrate 12 and by patterning the electrode layer, the transfer gate electrode 26 can be formed in a desired area. In the present exemplary embodiment, in an end portion of the photodiode PD, the transfer gate electrode 26 is formed at a position at which it partially overlaps the electric charge storage area 20, and the first dark current suppression area 21, which is formed so as to protrude more than the electric charge storage area 20, and the transfer auxiliary area 22.

Figure 5G:
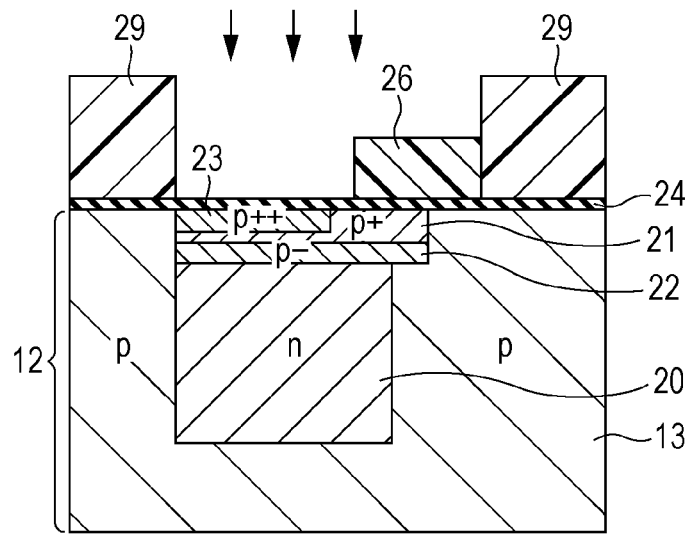
FIGS. 5G and 5H are process charts (No. 3) illustrating a method of manufacturing the solid-state imaging apparatus according to the first embodiment of the present disclosure.
Figure 5H:
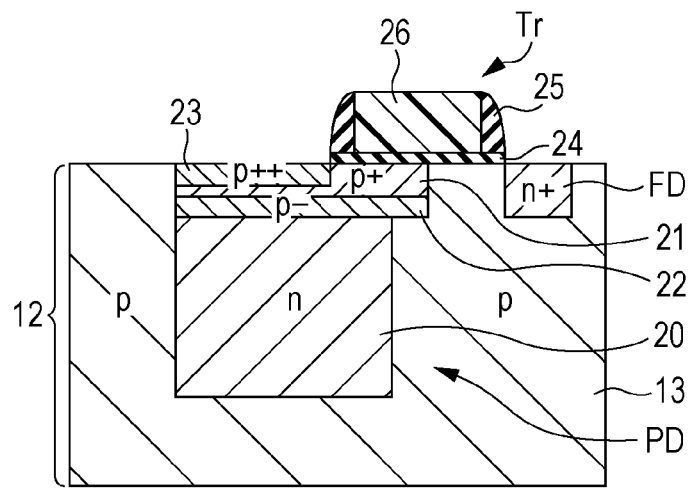

Next, as shown in FIG. 5G, a photo resist mask 29 in which an area where the photodiode PD is formed is opened is formed on the substrate 12. The photo resist mask 29 that is formed at this point has an opening from which an end portion of the transfer gate electrode 26 on the side where the photodiode PD is formed is exposed. Then, by ion-implanting a p-type impurity with the photo resist mask 29 in between, the second dark current suppression area 23 formed of a p-type semiconductor area (p++) is formed from the surface of the substrate 12 up to a depth at which the transfer auxiliary area 22 does not reach. The second dark current suppression area 23 is formed with a dosage higher than the dosage of the first dark current suppression area 21, thereby causing the impurity concentration to be higher than that of the first dark current suppression area 21. Then, the second dark current suppression area 23 is formed by self-alignment by using the transfer gate electrode 26 as a mask on the transfer gate electrode 26 side.

Next, after the photo resist mask 29 is removed, as shown in FIG. 5H, a side wall 25 is formed on the side surface of the transfer gate electrode 26, and the gate insulating film 24 other than below the transfer gate electrode 26 and the side wall 25 is removed. After that, a floating diffusion area FD is formed. Although the illustration of the floating diffusion area FD is omitted, the floating diffusion area FD is formed by ion-implanting an n-type impurity with a photo resist mask in between in which the area where the floating diffusion area FD is formed is opened. In this case, also, the floating diffusion area FD is formed by self-alignment by using the side wall 25 as a mask on the transfer gate electrode 26 side.

In the present exemplary embodiment, although an example has been described in which after the side wall 25 is formed, the floating diffusion area FD is formed by self-alignment by using the side wall 25 as a mask, the floating diffusion area FD may be formed before the side wall 25 is formed. Regarding the configuration of the floating diffusion area FD, the configuration of the floating diffusion area in a typical solid-state imaging apparatus can be adopted, and the configuration of the floating diffusion area FD is not limited to the present exemplary embodiment.

After that, by forming the wiring layer 14, the color filter layer 17, the planarization film 18, and the on-chip lens 19, which are shown in FIG. 2, in a manner similar to a typical method of manufacturing the solid-state imaging apparatus 1, the solid-state imaging apparatus 1 of the present exemplary embodiment is completed.

In the solid-state imaging apparatus 1 of the present exemplary embodiment, dark current resulting from the interface level of the substrate 12 is reduced by the second dark current suppression area 23 and the first dark current suppression area 21. Furthermore, in the solid-state imaging apparatus 1 of the present exemplary embodiment, in a case where transfer pulses are supplied to the transfer gate electrode 26, the amount of modulation of the potential inside the substrate 12 is determined by the impurity concentration of the transfer auxiliary area 22. In the present exemplary embodiment, as a result of forming the transfer auxiliary area 22, even when the impurity concentration of the p-type semiconductor area becomes high as a result of the formation of the first dark current suppression area 21 and the second dark current suppression area 23, it is possible to prevent transfer malfunction, improving transfer efficiency.

A description will be given below, by using comparative examples, of the effect of the dark current suppression in the solid-state imaging apparatus 1 of the present exemplary embodiment and the effect of the improvement in the transfer efficiency.

Figure 15:
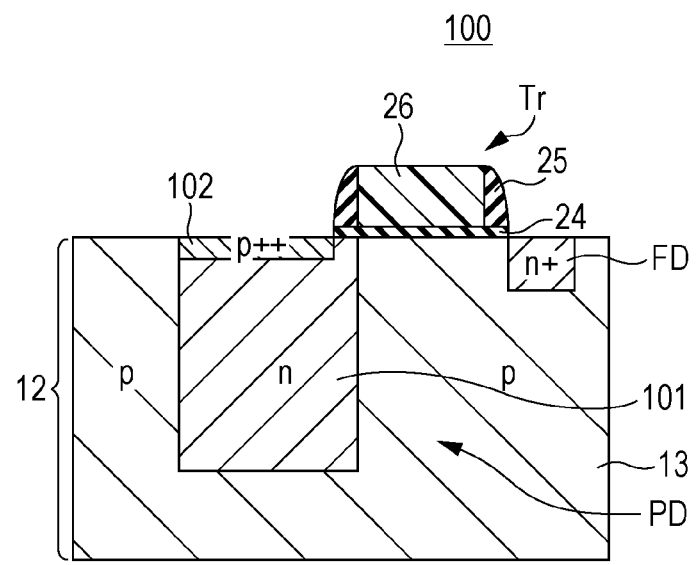
FIG. 15 is a cross-sectional block diagram of the main portion of a solid-state imaging apparatus according to comparative example 1.

FIG. 15 is a cross-sectional diagram of the main portion of a solid-state imaging apparatus 100 according to comparative example 1. Components in FIG. 15, which correspond to those of FIG. 2, are designated with the same reference numerals, and duplicate descriptions thereof are omitted.

In the solid-state imaging apparatus 100 according to comparative example 1, the photodiode PD includes a dark current suppression area 102 formed of a p-type semiconductor area formed on the surface of the substrate 12, and an electric charge storage area 101 formed of an n-type semiconductor area, which is formed in an under layer thereof. Then, after the transfer gate electrode 26 is formed, the electric charge storage area 101 is formed by self-alignment by using the transfer gate electrode 26 as a mask, and after the side wall 25 is formed, the dark current suppression area 102 is formed by self-alignment by using the side wall 25 as a mask.

In the solid-state imaging apparatus 100 according to comparative example 1, both the dark current suppression area 102 and the electric charge storage area 101 forming the photodiode PD are formed by self-alignment on the transfer gate electrode 26 side, forming a configuration resistant to processing variations. However, in the solid-state imaging apparatus 100 according to comparative example 1, the electric charge storage area 101 is not formed so as to be superposed directly below the transfer gate electrode 26. Consequently, only the portion below the side wall 25 is a portion that is modulated by the transfer gate electrode 26. For this reason, when the potential inside the photodiode PD is deepened, transfer malfunction occurs, presenting a problem from the viewpoint of securing of the amount of saturated charge (Qs) in a fine pixel.

Figure 16:
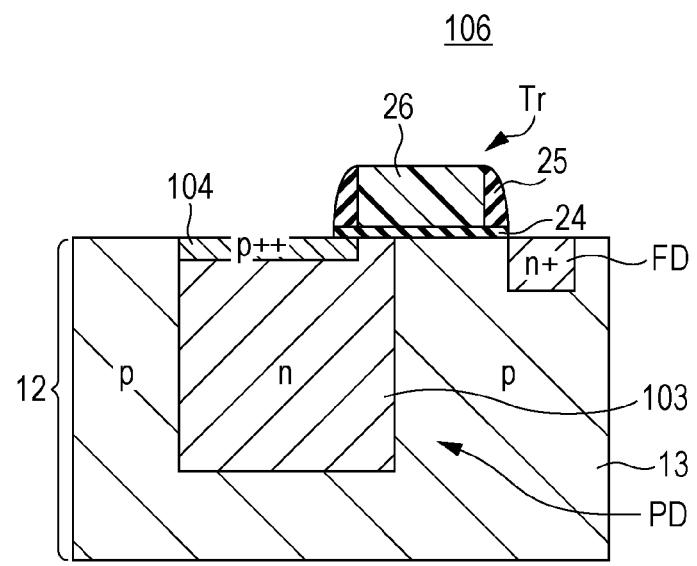
FIG. 16 is a cross-sectional block diagram of the main portion of a solid-state imaging apparatus according to comparative example 2.

FIG. 16 is a cross-sectional diagram of the main portion of a solid-state imaging apparatus 106 according to comparative example 2. Components in FIG. 16, which correspond to those of FIG. 2, are designated with the same reference numerals, and duplicate descriptions thereof are omitted.

In the solid-state imaging apparatus 106 according to comparative example 2, the photodiode PD is formed of a dark current suppression area 104 and an electric charge storage area 103 formed under the dark current suppression area 104. Similarly to the present exemplary embodiment, the electric charge storage area 103 is formed so as to be superposed directly below the transfer gate electrode 26. That is, in the solid-state imaging apparatus 106 according to comparative example 2, before the transfer gate electrode 26 is formed, the electric charge storage area 103 is formed by ion implantation, and before the side wall 25 is formed, the dark current suppression area 104 is formed by self-alignment by using the transfer gate electrode 26 as a mask.

In the solid-state imaging apparatus 106 according to comparative example 2, the electric charge storage area 103 is formed so as to be superposed directly below the transfer gate electrode 26, and thus the degree of modulation due to a voltage applied to the transfer gate electrode 26 is increased to more than that of comparative example 1. For this reason, the configuration is formed in such a way that even when the potential inside the photodiode PD is deepened, transfer malfunction is difficult to occur. Furthermore, since the dark current suppression area 104 is formed before the side wall 25 is formed, electrons that cause dark current are pinned also below the side wall 25.

In comparative example 2, in order to prevent transfer malfunction of signal electric charge, it is necessary to secure a distance between the end portion of the electric charge storage area 103 on the transfer gate electrode 26 side and the end portion of the dark current suppression area 104. That is, it is necessary to form the end portion of the electric charge storage area 103 so as to extend more toward the floating diffusion area FD than the end portion of the dark current suppression area 104. When the distance between the end portion of the electric charge storage area 103 and the end portion of the dark current suppression area 104 is decreased, transfer malfunction occurs due to an influence of the dark current suppression area 104.

However, in the solid-state imaging apparatus 106 of comparative example 2, since the electric charge storage area 103 is formed before the transfer gate electrode 26 is formed, the electric charge storage area 103 is not formed by self-alignment, forming a configuration vulnerable to processing variations. For this reason, the distance between the end portion of the electric charge storage area 103 and the end portion of the dark current suppression area 104 is decreased, presenting a problem that transfer malfunction occurs. Furthermore, since the electric charge storage area 103 is superposed directly below the transfer gate electrode 26, there is a problem in that the pinning effect below the transfer gate electrode 26 is weakened.

Furthermore, in a case where the electric charge storage area 103 is formed so as to be superposed directly below the transfer gate electrode 26, over-modulation of the potential occurs below the transfer gate electrode 26 at the time of transfer, and there is a risk in that transfer malfunction occurs. This transfer malfunction will be described with reference to FIGS. 17A and 17B.

Figure 17A:
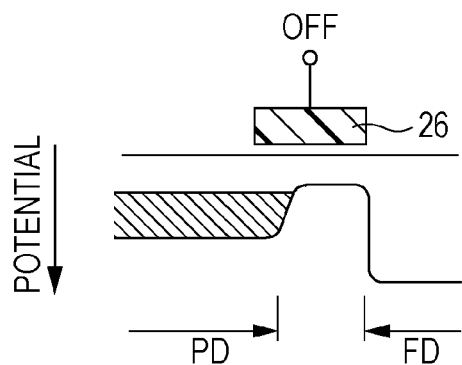
FIGS. 17A and 17B are potential diagrams from a photodiode PD to a floating diffusion area FD in a state in which a transfer transistor Tr is turned off and on, in the solid-state imaging apparatus of comparative example 2.
Figure 17B:
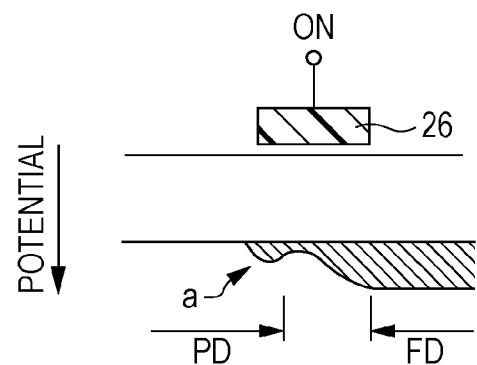

FIG. 17A illustrates a potential diagram from a photodiode PD in a state in which a transfer transistor Tr is turned off to a floating diffusion area FD in the solid-state imaging apparatus 106 of comparative example 2. FIG. 17B illustrates a potential diagram from a photodiode PD in a state in which a transfer transistor Tr is turned on to a floating diffusion area FD in the solid-state imaging apparatus 106 of comparative example 2.

As shown in FIG. 17A, in a state in which the transfer transistor Tr is turned off, signal electric charge has been stored in the electric charge storage area 103 of the photodiode PD. Then, as shown in FIG. 17B, when the transfer transistor Tr is turned on at the time of transfer, the potential below the transfer gate electrode 26 is deepened, and the signal electric charge stored in the photodiode PD is transferred to the floating diffusion area FD.

At this time, when the electric charge storage area 103 formed of an n-type semiconductor area is formed so as to be superposed directly below the transfer gate electrode 26, that portion is partially over-modulated in the direction in which potential is deepened, and as shown in FIG. 17B, a potential dip "a" occurs. When the potential dip "a" occurs, signal electric charge accumulates in that portion, and will not be transferred to the floating diffusion area FD. As described above, in the case where the amount of overlap of the electric charge storage area 103 below the transfer gate electrode 26 is large, there is a probability that transfer malfunction occurs. Therefore, in the solid-state imaging apparatus 106 of comparative example 2, transfer malfunction due to processing variations is likely to occur.

Figure 18:
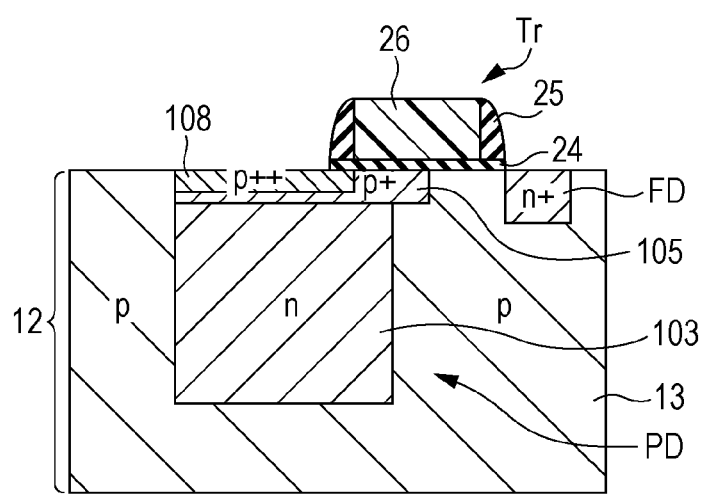
FIG. 18 is a cross-sectional block diagram of the main portion of a solid-state imaging apparatus according to comparative example 3.

FIG. 18 is a cross-sectional diagram of the main portion of a solid-state imaging apparatus 107 according to comparative example 3. Components in FIG. 18, which correspond to those in FIG. 2, are designated with the same reference numerals, and duplicate descriptions thereof are omitted.

In the solid-state imaging apparatus 107 according to comparative example 3, the dark current suppression area of a photodiode PD is configured to have a first dark current suppression area 105 that is formed so as to be superposed directly below the transfer gate electrode 26, and a second dark current suppression area 108 that is formed up to below the side wall 25. In comparative example 3, similarly to the present exemplary embodiment, the electric charge storage area 103 and the first dark current suppression area 105 are formed before the transfer gate electrode 26 is formed, and the second dark current suppression area 108 is formed by self-alignment by using the transfer gate electrode 26 as a mask after the transfer gate electrode 26 is formed.

In comparative example 3, the first dark current suppression area 105 is formed on the electric charge storage area 103 that is formed so as to be superposed directly below the transfer gate electrode 26. Consequently, the over-modulation of the potential in the electric charge storage area 103 below the transfer gate electrode 26 is prevented. For this reason, the potential dip "a" such as that shown in FIG. 17B is reduced. Furthermore, below the transfer gate electrode 26, suppression in the dark current is achieved.

However, in the configuration of comparative example 3, if the impurity concentration of the first dark current suppression area 105 increases, the amount of modulation of the potential below the transfer gate electrode 26 decreases, and there is a probability that transfer malfunction occurs. Furthermore, there is a problem that pinning on the surface of the substrate 12 over the entire area of the photodiode PD is difficult to be sufficiently achieved with only the first dark current suppression area 105.

Furthermore, the impurity concentration becomes thick in a portion of the transfer gate electrode 26 due to an influence of the overlap between the second dark current suppression area 108 formed of a p-type semiconductor area (p++) at a high concentration and the first dark current suppression area 105 formed of a p-type semiconductor area (p+) at a concentration lower than that. As a result of the above, the effect of pinning on the surface of the substrate 12 improves. However, the amount of modulation of the potential at the time of transfer decreases, and transfer malfunction may occur. Furthermore, if there is misalignment between the first dark current suppression area 105 and the electric charge storage area 103, similarly to comparative example 2, the potential dip "a" may occur.

Therefore, the optimization of the dosages of the second dark current suppression area 108 and the first dark current suppression area 105 become necessary.

As described above, since the impurity concentration profile around the transfer gate electrode 26 affects the transfer efficiency, the amount of saturated charge, and the influence of suppression of dark current, it is difficult for the configurations of comparative examples 1 to 3 to satisfy all the above-mentioned criteria.

On the other hand, in the solid-state imaging apparatus 1 of the present exemplary embodiment, pinning of electrons, which is a factor of dark current below the transfer gate electrode 26, can be secured by the first dark current suppression area 21 formed of a p-type semiconductor area (p+), which is formed by increasing dosage and by shallowing the implantation of energy. Furthermore, the improvement of the potential dip "a" below the transfer gate electrode 26 can be made by the transfer auxiliary area 22 formed of a p-type semiconductor area (p−).

Figure 6A:
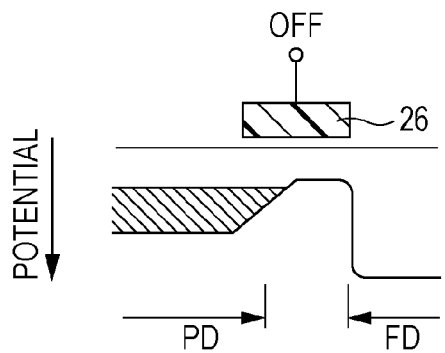
FIGS. 6A and 6B illustrate potential diagrams from a photodiode PD to a floating diffusion area FD in a state in which a transfer transistor Tr is turned off and on, in the solid-state imaging apparatus according to the first embodiment of the present disclosure.
Figure 6B:
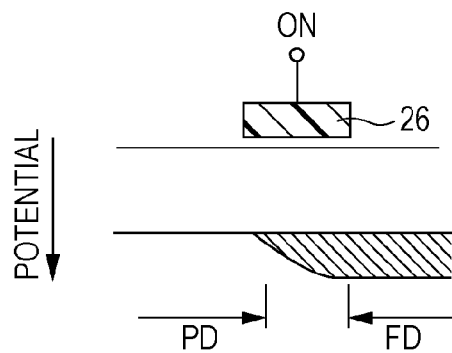

FIG. 6A illustrate a potential diagram from a photodiode PD in a state in which the transfer transistor Tr is turned off to a floating diffusion area FD in the solid-state imaging apparatus 1 according to the present exemplary embodiment. FIG. 6B illustrates a potential diagram from a photodiode PD in a state in which the transfer transistor Tr is turned on to a floating diffusion area FD in the solid-state imaging apparatus 1 according to the present exemplary embodiment.

As shown in FIG. 6A, in the state in which the transfer transistor Tr is turned off, signal electric charge has been stored in the electric charge storage area 20 of the photodiode PD. Then, as shown in FIG. 6B, when the transfer transistor Tr is turned on at the time of transfer, the potential below the transfer gate electrode 26 is deepened, and the signal electric charge that has been stored in the photodiode PD is transferred to the floating diffusion area FD.

In the present exemplary embodiment, the first dark current suppression area 21 formed of a p-type semiconductor area (p+) having a high concentration, and the transfer auxiliary area 22 formed of a p-type semiconductor area (p−) having a low concentration are formed in the space with the electric charge storage area 20. As a result, the amount of modulation of the potential below the transfer gate electrode 26 is determined by the impurity concentration of the transfer auxiliary area 22. Consequently, the potential below the transfer gate electrode 26 becomes moderately deep from the photodiode PD to the floating diffusion area FD, and the potential dip is reduced. Furthermore, since the transfer efficiency is improved, a decrease in the amount of saturated charge (Qs) is also suppressed.

Furthermore, in comparative example 3, there is a risk that in a portion of the transfer gate electrode 26, the amount of modulation of the potential is decreased due to an influence of overlap between the second dark current suppression area 108 and the first dark current suppression area 105, and transfer malfunction may occur. However, in the present exemplary embodiment, since the amount of modulation inside the photodiode PD at the time of transfer is determined by the transfer auxiliary area 22, which is formed of a p-type semiconductor area (p−) having a low concentration, which is formed in contact with the electric charge storage area 20, it is possible to suppress the occurrence of transfer malfunction.

Furthermore, in the present exemplary embodiment, the first dark current suppression area 21, which has been formed earlier, is formed thinly between the second dark current suppression area 23 and the electric charge storage area 20. For this reason, the photodiode PD has the advantage that the potential dip can be reduced.

Figure 7:
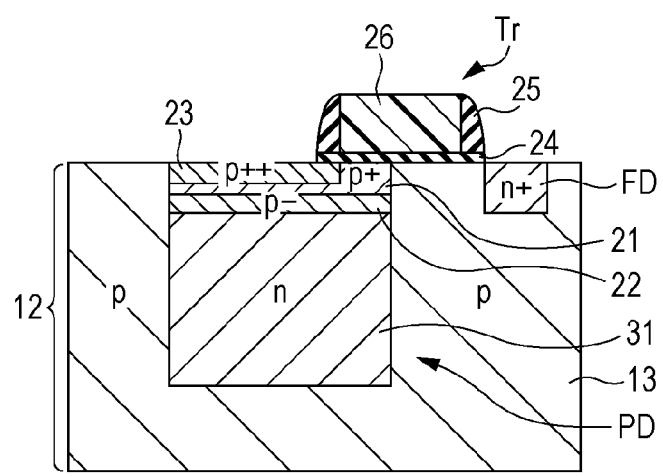
FIG. 7 illustrates a cross-sectional configuration of the main portion of a solid-state imaging apparatus according to a second embodiment of the present disclosure.

2. Second Embodiment: Solid-State Imaging Apparatus 2-1 Configuration of Main Portion Next, a description will be given of a solid-state imaging apparatus according to a second embodiment of the present disclosure. Since the overall configuration of the solid-state imaging apparatus in the present embodiment is the same as in FIG. 1, the description thereof is omitted. FIG. 7 is a cross-sectional diagram of the main portion of a solid-state imaging apparatus 30 according to the present exemplary embodiment. Components in FIG. 7, which correspond to those in FIG. 2, are designated with the same reference numerals, and duplicate descriptions thereof are omitted.

As shown in FIG. 7, in the solid-state imaging apparatus 30 of the present exemplary embodiment, the end portion on the transfer gate electrode 26 side of the electric charge storage area 31 is formed so as to have positional alignment with the end portions of the first dark current suppression area 21 and the transfer auxiliary area 22.

2-2 Manufacturing Method

Figure 8A:
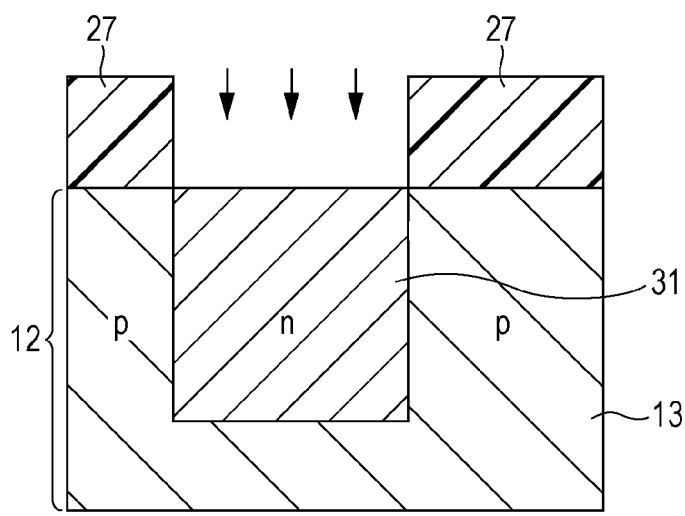
FIGS. 8A, 8B, and 8C are process charts illustrating a method of manufacturing the solid-state imaging apparatus according to the second embodiment of the present disclosure.
Figure 8B:
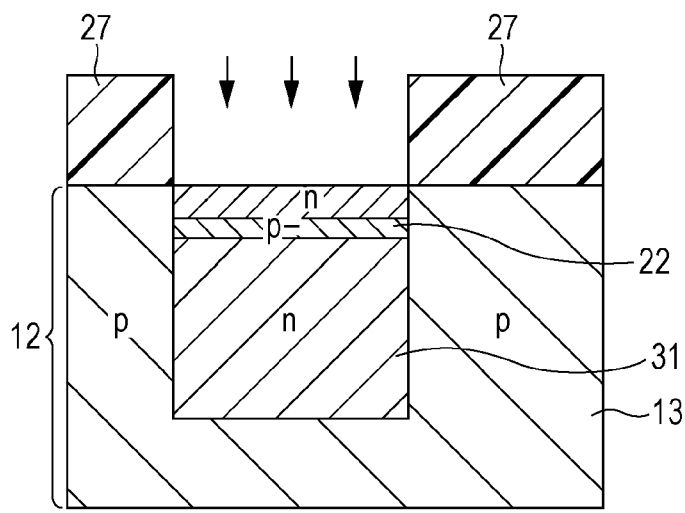
Figure 8C:
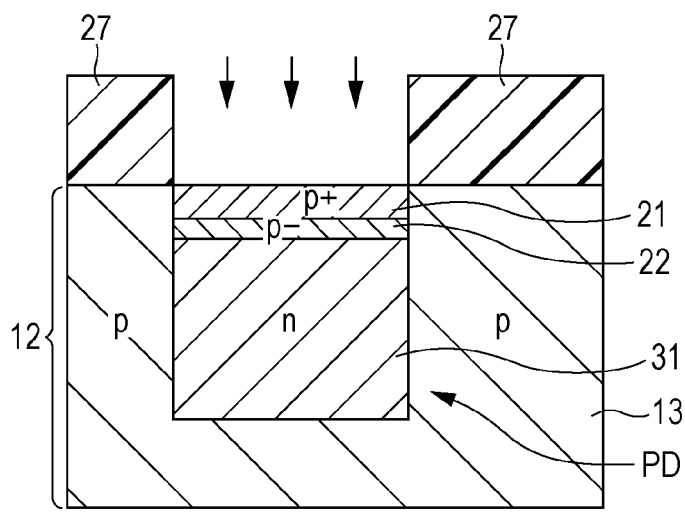

A description will be given below of a method of manufacturing the solid-state imaging apparatus 30 according to the present exemplary embodiment. FIGS. 8A, 8B, and 8C are process charts illustrating the method of manufacturing the solid-state imaging apparatus 30 according to the present exemplary embodiment.

First, as shown in FIG. 8A, similarly to the first embodiment, an electric charge storage area 31 formed of an n-type semiconductor area is formed. After that, as shown in FIG. 8B, by using the photo resist mask 27 used for forming the electric charge storage area 31 and by ion-implanting a p-type impurity at a desired depth of the substrate 12, the transfer auxiliary area 22 is formed.

Next, as shown in FIG. 8C, by using the photo resist mask 27 and by ion-implanting a p-type impurity at a concentration higher than the impurity concentration of the transfer auxiliary area 22, the first dark current suppression area 21 is formed from the surface of the substrate 12 to a depth that reaches the transfer auxiliary area 22.

After that, in the steps same as those of FIGS. 4F to 5H in the first embodiment, it is possible to form the solid-state imaging apparatus 30 of the present exemplary embodiment.

In the present exemplary embodiment, it is possible to form all the electric charge storage area 31, the transfer auxiliary area 22, and the first dark current suppression area 21 by using the same photo resist mask 27. This enables the number of steps to be reduced. Furthermore, the misalignment of the positions where the electric charge storage area 31, the transfer auxiliary area 22, and the first dark current suppression area 21 are formed does not occur. Consequently, it is possible to prevent pinning below the transfer gate electrode 26 from being weakened, which is caused due to the fact that the misalignment is large.

In addition, the same advantages as those of the first embodiment can be obtained.

Figure 9:
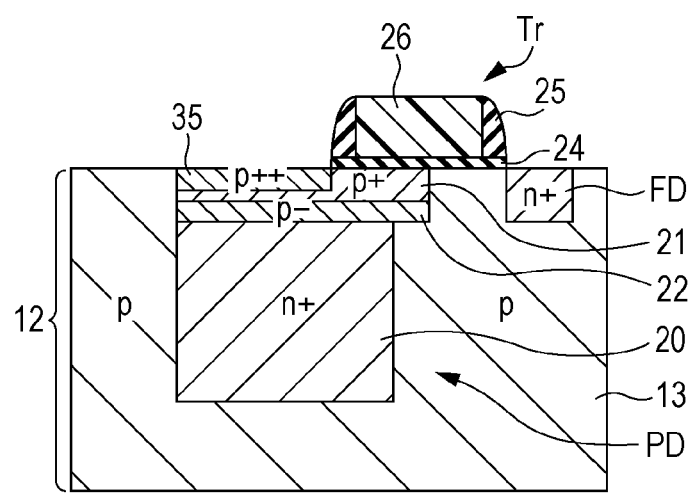
FIG. 9 illustrates a cross-sectional configuration of the main portion of a solid-state imaging apparatus according to a third embodiment of the present disclosure.

3. Third Embodiment: Solid-State Imaging Apparatus 3-1 Configuration of Main Portion Next, a description will be given of a solid-state imaging apparatus according to a third embodiment of the present disclosure. Since the entire configuration of the solid-state imaging apparatus in the present embodiment is the same as in FIG. 1, the description thereof is omitted. FIG. 9 illustrates a cross-sectional structure of the main portion of a solid-state imaging apparatus 34 according to the present exemplary embodiment. Components in FIG. 9, which correspond to those of FIG. 2, are designated with the same reference numerals, and duplicate descriptions thereof are omitted. As shown in FIG. 9, in the solid-state imaging apparatus 34 of the present exemplary embodiment, the formation area of the second dark current suppression area 35 is structured in a manner different from the solid-state imaging apparatus 1 according to the first embodiment, and the second dark current suppression area 35 is formed so as not to overlap below the side wall 25.

3-2 Manufacturing Method

Figure 10A:
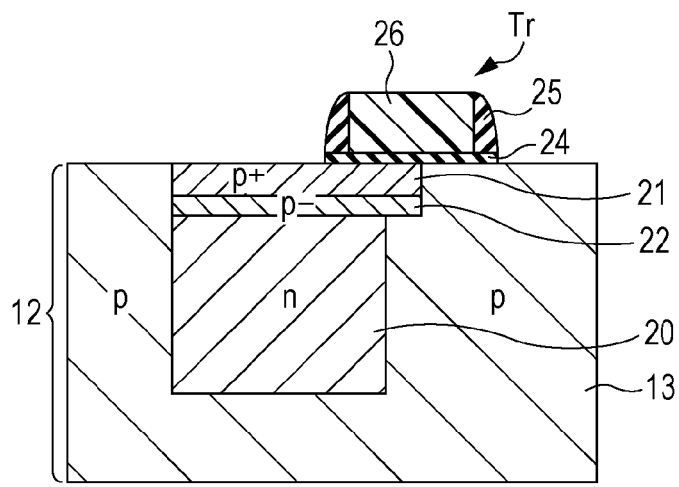
FIGS. 10A, 10B, and 10C are process charts illustrating a method of manufacturing the solid-state imaging apparatus according to the third embodiment of the present disclosure.
Figure 10B:
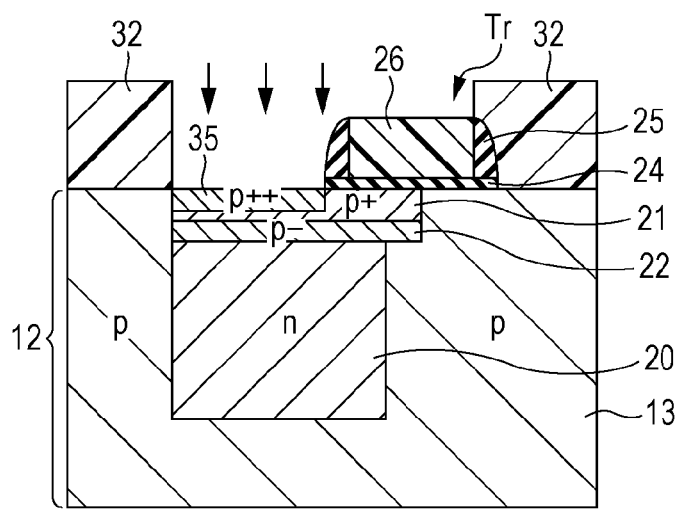
Figure 10C:
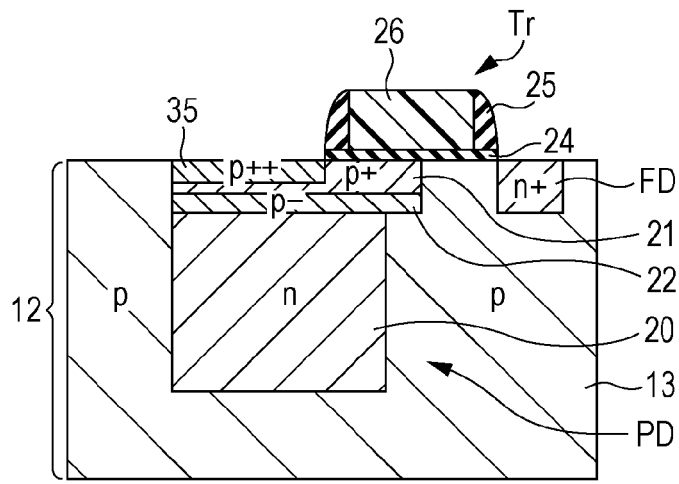

A description will be given below of a method of manufacturing the solid-state imaging apparatus 34 of the present exemplary embodiment. FIGS. 10A to 10C are process charts illustrating the method of manufacturing the solid-state imaging apparatus 34 of the present exemplary embodiment. Since the steps until the transfer gate electrode 26 is formed are the same as the steps of FIGS. 3A to 4F of the first embodiment, the illustrations thereof are omitted, and repeated description thereof is omitted.

After the transfer gate electrode 26 is formed, as shown in FIG. 10A, the side wall 25 is formed on the side surface of the transfer gate electrode 26. After that, the gate insulating films 24, the transfer gate electrode 26 and the side wall 25 are removed.

Next, as shown in FIG. 10B, a photo resist mask 32 whose area where the photodiode PD is formed is opened is formed. Here, the photo resist mask 32 is formed in such a manner as to have an opening that does not cover the end portion of the side wall 25 on the side where the photodiode PD is formed. Then, by ion-implanting a p-type impurity with the photo resist mask 32 in between, the second dark current suppression area 35 formed of a p-type semiconductor area (p++) is formed from the surface of the substrate 12 to a depth that does not reach the transfer auxiliary area 22. By forming the second dark current suppression area 35 at a dosage higher than the dosage of the first dark current suppression area 21, the impurity concentration is set to be higher than that in the first dark current suppression area 21. Then, the second dark current suppression area 35 is formed by self-alignment by using the side wall 25 as a mask on the transfer gate electrode 26 side.

Next, the photo resist mask 32 is removed, and as shown in FIG. 10C, the floating diffusion area FD is formed. Although the illustration of the floating diffusion area FD is omitted, the floating diffusion area FD is formed by ion-implanting an n-type impurity with a photo resist mask in between, whose area where the floating diffusion area FD is formed is opened. Also, in this case, the floating diffusion area FD is formed by self-alignment by using the side wall 25 as a mask on the transfer gate electrode 26 side.

After that, in the same manner as the typical method of manufacturing a solid-state imaging apparatus, the wiring layer 14, the color filter layer 17, the planarization film 18, and the on-chip lens 19, which are shown in FIG. 2, are formed, thereby completing the solid-state imaging apparatus 34 of the present embodiment example.

In the solid-state imaging apparatus 34 of the present exemplary embodiment, since the second dark current suppression area 35 formed of a p-type semiconductor area having a high concentration is not formed up to a portion of the transfer gate electrode 26, transfer malfunction is reduced. Furthermore, under the transfer gate electrode 26, the first dark current suppression area 21 formed of a p-type semiconductor area is formed although it has a concentration lower than the impurity concentration of the second dark current suppression area 35. For this reason, it is possible to obtain advantages of pinning below the side wall 25 and the transfer gate electrode 26.

In addition, the same advantages as those of the first embodiment can be obtained.

Figure 11:
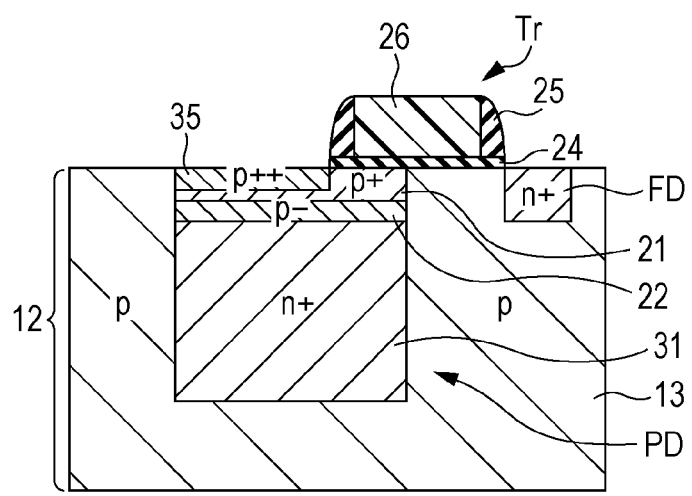
FIG. 11 illustrates a cross-sectional configuration of a solid-state imaging apparatus according to a fourth embodiment of the present disclosure.

4. Fourth Embodiment: Solid-State Imaging Apparatus 4-1 Configuration of Main Portion Next, a description will be given below of a solid-state imaging apparatus according to a fourth embodiment of the present disclosure. Since the entire configuration of the solid-state imaging apparatus in the present embodiment is the same as that of FIG. 1, the description thereof is omitted. FIG. 11 is a cross-sectional diagram of the main portion of a solid-state imaging apparatus 37 of the present exemplary embodiment. Components in FIG. 11, which correspond to those of FIG. 2, are designated with the same reference numerals, and duplicate descriptions thereof are omitted.

As shown in FIG. 11, unlike the solid-state imaging apparatus 30 according to the second embodiment, in the solid-state imaging apparatus 37 of the present exemplary embodiment, the area of the second dark current suppression area 35 is formed in such a manner as not to overlap under the side wall 25.

4-2 Manufacturing Method

Figure 12A:
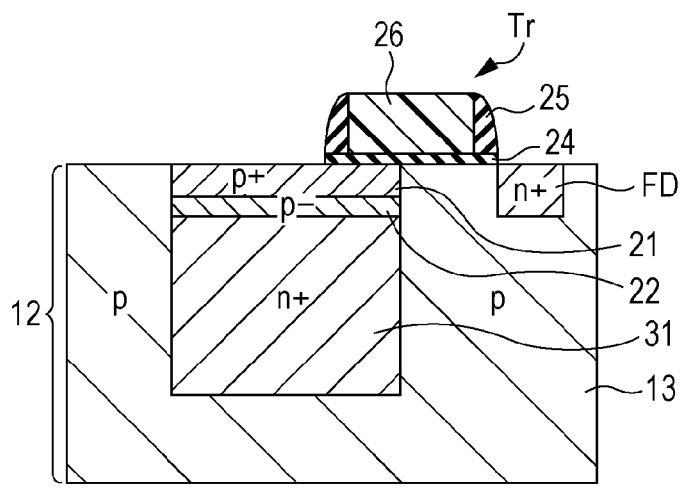
FIGS. 12A, 12B, and 12C are process charts illustrating a method of manufacturing the solid-state imaging apparatus according to the fourth embodiment of the present disclosure.
Figure 12B:
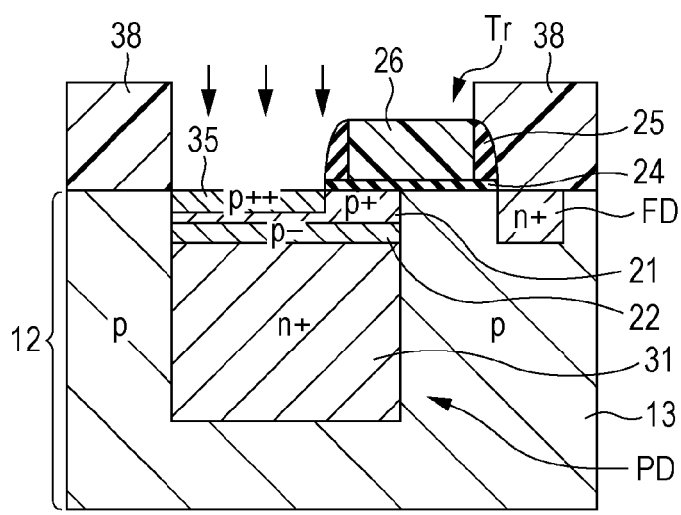
Figure 12C:
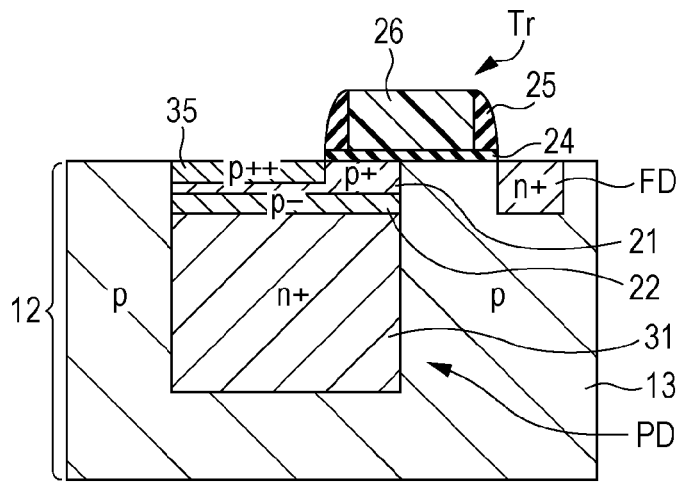

A description will be given below of a method of manufacturing the solid-state imaging apparatus 37 of the present exemplary embodiment. FIGS. 12A to 12C are process charts illustrating a method of manufacturing the solid-state imaging apparatus 37 according to the present exemplary embodiment. The steps until the transfer gate electrode 26 is formed are the same as those of the second embodiment, and thus repeated description thereof is omitted.

After the transfer gate electrode 26 is formed, as shown in FIG. 12A, the side wall 25 is formed on the side surface of the transfer gate electrode 26. After that, the gate insulating film 24 other than below the transfer gate electrode 26 and the side wall 25 is removed.

Next, as shown in FIG. 12B, a photo resist mask 38 whose area where the photodiode PD is formed is opened is formed. Here, the photo resist mask 38 is formed so as to have an opening that does not cover the end portion of the side wall 25 on the side where the photodiode PD is formed. Then, by ion-implanting a p-type impurity through the photo resist mask 38, the second dark current suppression area 35 of a p-type semiconductor area (p++) is formed from the surface of the substrate 12 to a depth that does not reach the transfer auxiliary area 22. The second dark current suppression area 35 is formed at a dosage higher than the dosage of the first dark current suppression area 21, so that the impurity concentration thereof is set to be higher than that of the first dark current suppression area 21. Then, the second dark current suppression area 35 is formed by self-alignment by using the side wall 25 as a mask on the transfer gate electrode 26 side.

Next, the photo resist mask 38 is removed, and as shown in FIG. 12C, the floating diffusion area FD is formed. Although the illustration of the floating diffusion area FD is omitted, the floating diffusion area FD is formed by ion-implanting an n-type impurity through a photo resist mask whose area where the floating diffusion area FD is formed is opened. Also, in this case, the floating diffusion area FD is formed by self-alignment by using the side wall 25 as a mask on the transfer gate electrode 26 side.

After that, similarly to a typical method of manufacturing a solid-state imaging apparatus, the solid-state imaging apparatus 37 of the present exemplary embodiment is completed by forming the wiring layer 14, the color filter layer 17, the planarization film 18, and the on-chip lens 19, which are shown in FIG. 2.

After that, similarly to the typical method of manufacturing a solid-state imaging apparatus, the solid-state imaging apparatus of the present exemplary embodiment is completed by forming a wiring layer, a color filter layer, a planarization film, and an on-chip lens. Also, in the present exemplary embodiment, the same advantages as in the second and third embodiments can be obtained.

Figure 13:
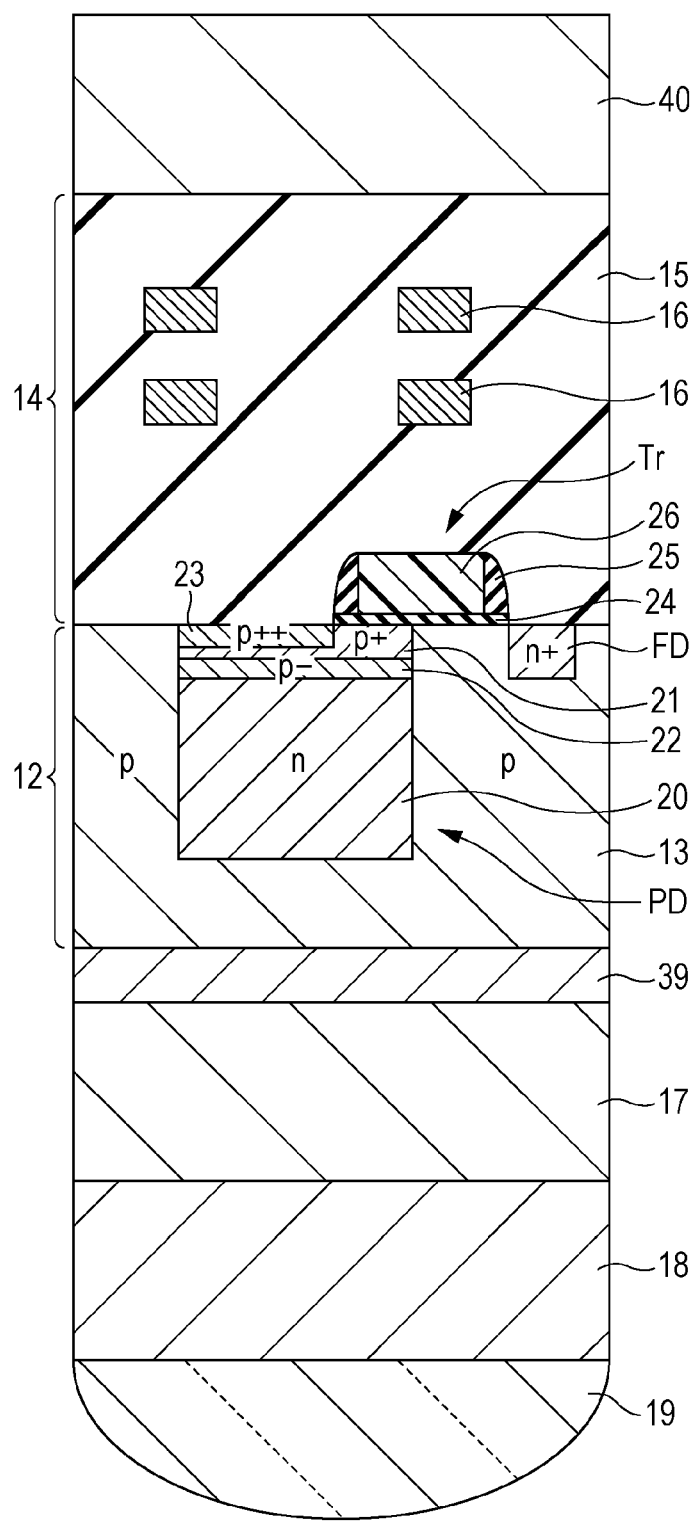
FIG. 13 illustrates a cross-sectional configuration of a solid-state imaging apparatus according to a fifth embodiment of the present disclosure.

5. Fifth Embodiment: Reverse-Surface-Irradiation-Type Solid-State Imaging Apparatus Next, a description will be given of a solid-state imaging apparatus according to a fifth embodiment of the present disclosure. In the present exemplary embodiment, a description will be given of a case in which the configuration of the present disclosure is applied to a reverse-surface-irradiation-type solid-state imaging apparatus. FIG. 13 illustrates a cross-sectional configuration of a solid-state imaging apparatus 41 according to the present exemplary embodiment. Components in FIG. 13, which correspond to those of FIG. 2, are designated with the same reference numerals, and duplicate descriptions thereof are omitted.

As shown in FIG. 13, in a solid-state imaging apparatus 41 of the present exemplary embodiment, the color filter layer 17, the planarization film 18, and the on-chip lens 19 are formed with an oxide film 39 in between on the reverse surface side of the substrate 12. Furthermore, a support substrate 40 is laminated with the upper area of the wiring layer 14 formed on the surface side of the substrate 12. Then, the solid-state imaging apparatus 41 of the present exemplary embodiment is configured in such a manner that light enters from the reverse surface side of the substrate 12.

As has been described above, in the reverse-surface-irradiation-type solid-state imaging apparatus 41, also, the configuration of the present disclosure can be applied. In the present exemplary embodiment, an example has been described in which the pixel configuration according to the first embodiment is applied to the reverse-surface-irradiation-type solid-state imaging apparatus 41. Alternatively, the pixel configuration according to the second to fourth embodiments can be applied.

Also, in the present exemplary embodiment, the same advantages as those of the first embodiment can be obtained.

In the solid-state imaging apparatuses according to the first to fifth embodiments, a configuration in which negative electric charge (electrons) is used as signal electric charge has been described. Alternatively, the present disclosure can be applied to a case in which positive electric charge (holes) is used as signal electric charge. In a case where holes are used as signal electric charge, in the solid-state imaging apparatus according to the first to fifth embodiments, the configuration of the first conduction type and the configuration of the second conduction type may be reversed, and p-channel-type pixel transistors are formed. Furthermore, in the first to fifth embodiments, although a description has been given by using a CMOS-type solid-state imaging apparatus as an example, the present disclosure can also be applied to a CCD-type solid-state imaging apparatus.

Furthermore, in the present disclosure, not limited to a solid-state imaging apparatus that detects the distribution of the amount of incidence light of the visible light so as to capture an image, a solid-state imaging apparatus that captures the distribution of the incidence light of an infrared, an X ray, or particles as an image can also be used. In a wide sense, the present disclosure can be applied in general to solid-state imaging apparatuses (physical quantity distribution detection apparatuses) that detect the distribution of physical quantity of pressure, electrostatic capacitance or the like so as to capture an image, such as fingerprint detection sensors.

In addition, the present disclosure is not limited to a solid-state imaging apparatus that sequentially scans each unit pixel of a pixel area in units of rows so as to read a pixel signal from each unit pixel. The present disclosure can be applied to an X-Y address-type solid-state imaging apparatus that selects arbitrary pixels in units of pixels and read signals in units of pixels from the selected pixels. The solid-state imaging apparatus may be formed as onechip, and may be in a module-like form having an image-capturing function in which a pixel area, a signal processing unit, and/or an optical system are collectively packaged.

Furthermore, the present disclosure is not limited to a solid-state imaging apparatus and can be applied to an imaging apparatus. Here, the term "imaging apparatus" refers to a camera system, such as a digital still camera or a video camera, and an electronic apparatus having an image-capturing function, such as a mobile phone. There is a case in which a module-like form mounted in an electronic apparatus, that is, a camera module, is used as an imaging apparatus.

6. Sixth Embodiment: Electronic Apparatus

Figure 14:
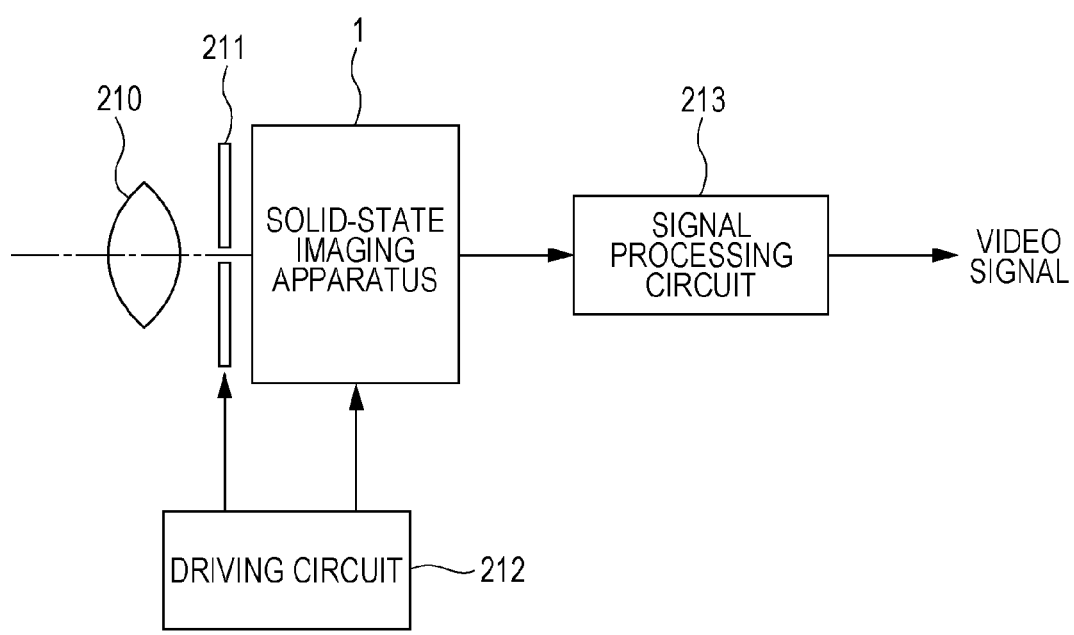
FIG. 14 is a schematic block diagram of an electronic apparatus according to a sixth embodiment of the present disclosure.

Next, a description will be given of an electronic apparatus according to a sixth embodiment of the present disclosure. FIG. 14 is a schematic block diagram of an electronic apparatus 200 according to the sixth embodiment of the present disclosure.

The electronic apparatus 200 according to the present embodiment includes the solid-state imaging apparatus 1, an optical lens 210, a shutter device 211, a driving circuit 212, and a signal processing circuit 213. The electronic apparatus 200 of the present exemplary embodiment is an embodiment in a case where the solid-state imaging apparatus 1 in the first embodiment of the present disclosure described as the solid-state imaging apparatus 1 is used for an electronic apparatus (camera).

The optical lens 210 causes image light (incident light) from a subject to be formed as an image on the image-capturing plane of the solid-state imaging apparatus 1. As a result, signal electric charge is stored for a fixed period inside the solid-state imaging apparatus 1. The shutter device 211 controls the light irradiation period and the light shielding period for the solid-state imaging apparatus 1. The driving circuit 212 supplies a driving signal for controlling the transfer operation of the solid-state imaging apparatus 1 and the shutter operation of the shutter device 211. The driving signal (timing signal) supplied from the driving circuit 212 allows the signal transfer of the solid-state imaging apparatus 1. The signal processing circuit 213 performs various signal processing. The video signal after signal processing has been performed is stored on a storage medium, such as a memory, or is output to a monitor.

In the electronic apparatus 200 of the present exemplary embodiment, suppression of dark current and transfer efficiency are secured in the solid-state imaging apparatus 1, thereby achieving improvement in the image quality.

Examples of the electronic apparatus 200 that can be applied to the solid-state imaging apparatus 1 are not limited to a camera, and can be applied to an imaging apparatus, such as a digital still camera, and a camera module for use with a mobile device, such as a mobile phone.

In the present exemplary embodiment, the solid-state imaging apparatus 1 in the present exemplary embodiment is configured so as to be used for an electronic apparatus. Alternatively, the solid-state imaging apparatus, which is manufactured in the second to fifth embodiments, can be used.

The present disclosure can take the following configurations.

(1) A solid-state imaging apparatus including
  a transfer gate electrode formed on a semiconductor substrate; and
  a photoelectric conversion unit including
    an electric charge storage area that is formed from a surface side of the semiconductor substrate in a depth direction, the electric charge storage area being formed of a first conductive type impurity area that is formed so as to partially overlap the transfer gate electrode,
    a transfer auxiliary area formed of a second conductive type impurity area that is formed in such a manner as to partially overlap the transfer gate electrode, the transfer auxiliary area being formed in an upper layer of the electric charge storage area, and
    a dark current suppression area that is a first dark current suppression area formed in an upper layer of the transfer auxiliary and formed so as to have positional alignment in such a manner that the end portion of the transfer auxiliary area on the transfer gate electrode side is at the same position as the end portion of the transfer auxiliary area, the dark current suppression area being formed of an impurity area having the same conductive type impurity area as the transfer auxiliary area and being formed of an impurity area having a concentration higher than that of the transfer auxiliary area.

(2) The solid-state imaging apparatus as set forth in the above (1), wherein the photoelectric conversion unit includes an outermost surface dark current suppression area that is formed on an outermost surface of the semiconductor substrate in an upper layer of the transfer auxiliary area and that does not extend below the transfer gate electrode, the outermost surface dark current suppression area being formed of an impurity area of a conductive type the same as that of the dark current suppression area and being formed of an impurity area having a concentration higher than that of the dark current suppression area.

(3) The solid-state imaging apparatus as set forth in the above (2), further including a reading area from which signal electric charge that is transferred from the photoelectric conversion unit is read on the surface side of the semiconductor substrate,
  wherein the amount of overlap between the dark current suppression area and the transfer auxiliary area; and the transfer gate electrode is made to be larger on the reading area side than the amount of overlap between the electric charge storage area and the transfer gate electrode.

(4) The solid-state imaging apparatus as set forth in the above (3),
  wherein the transfer gate electrode includes a side wall on the side surface of the transfer gate electrode, and
  wherein the outermost surface dark current suppression area is formed so as to overlap below the side wall.

(5) The solid-state imaging apparatus as set forth in the above (1), wherein the end portion on the transfer gate electrode side of the electric charge storage area is set at substantially the same position as the end portion on the transfer gate electrode side of the dark current suppression area and the transfer auxiliary area.

(6) A method of manufacturing a solid-state imaging apparatus, including:
  forming a photoelectric conversion unit including
    forming an electric charge storage area by ion-implanting an impurity of a first conductive type from the surface side in a depth direction,
    forming a transfer auxiliary area by ion-implanting an impurity of a second conductive type in an upper layer of the electric charge storage area, and
    forming a dark current suppression area by ion-implanting an impurity of the second conductive type at a concentration higher than that of the transfer auxiliary area in an upper layer of the transfer auxiliary area with a mask used for the formation of the transfer auxiliary area in between; and
  forming a transfer gate electrode that partially overlaps the electric charge storage area, the transfer auxiliary area, and the dark current suppression area on the semiconductor substrate.

(7) The method of manufacturing a solid-state imaging apparatus as set forth in the above (6), further including forming an outermost surface dark current suppression area by ion-implanting an impurity of a second conductive type at a concentration higher than that in the dark current suppression area on the outermost surface of the semiconductor substrate in an upper layer of the dark current suppression area after the transfer gate electrode is formed.

(8) The method of manufacturing a solid-state imaging apparatus as set forth in the above (7), further including forming a reading area from which signal electric charge transferred from the photoelectric conversion unit is read after the transfer gate electrode is formed on the surface side of the semiconductor substrate.

(9) The method of manufacturing a solid-state imaging apparatus as set forth in the above (8), wherein the amount of overlap between the dark current suppression area and the transfer auxiliary area; and the transfer gate electrode is made to be larger on the reading area side than the amount of overlap between the electric charge storage area and the transfer gate electrode.

(10) The method of manufacturing a solid-state imaging apparatus as set forth in the above (9), wherein the outermost surface dark current suppression area is formed by self-alignment by using the transfer gate electrode as a mask.

(11) The method of manufacturing a solid-state imaging apparatus as set forth in the above (10), further including forming a side wall on the side surface of the transfer gate electrode after the transfer gate electrode is formed,
wherein the outermost surface dark current suppression area is formed by self-alignment by using the side wall as a mask.

(12) The method of manufacturing a solid-state imaging apparatus as set forth in the above (6), further including forming the electric charge storage area, the transfer auxiliary area, and the dark current suppression area by performing ion implantation using the same mask.

(13) An electronic device including:
an optical lens;
a solid-state imaging apparatus to which light collected in the optical lens enters, the solid-state imaging apparatus including
a photoelectric conversion unit including
a transfer gate electrode formed on a semiconductor substrate, and
an electric charge storage area that is formed from a surface side of the semiconductor substrate in a depth direction, the electric charge storage area being formed of a first conductive type impurity area that is formed so as to partially overlap the transfer gate electrode,
a transfer auxiliary area formed of a second conductive type impurity area that is partially formed so as to overlap the transfer gate electrode, the transfer auxiliary area being formed in an upper layer of the electric charge storage area, and
a dark current suppression area that is formed in an upper layer of the transfer auxiliary area in such a manner that the end portion on the transfer gate electrode side has positional alignment with the end portion of the transfer auxiliary area, the dark current suppression area being formed of an impurity area of a conductive type the same as that of the transfer auxiliary area and being formed of an impurity area having a concentration higher than that of the transfer auxiliary area; and
a signal processing circuit configured to process an output signal output from the solid-state imaging apparatus.

It should be understood by those skilled in the art that various modifications, combinations, sub-combinations and alterations may occur depending on design requirements and other factors insofar as they are within the scope of the appended claims or the equivalents thereof.

What is claimed is:

1. A method of manufacturing a solid-state imaging apparatus, comprising:
forming a transfer gate electrode area; and
forming a photoelectric conversion unit including
forming an electric charge storage area by ion-implanting an impurity of a first conductive type from a surface side of a semiconductor substrate in a depth direction, wherein the electric charge storage area partially overlaps the transfer gate electrode, and wherein a first end surface of the electric charge storage area is perpendicular to the surface side of the semiconductor substrate,
forming a first dark current suppression area by ion-implanting an impurity of a second conductive type at a first concentration, wherein the first dark current suppression area partially overlaps the transfer gate electrode and entirely overlaps the electric charge storage area, and wherein a first end surface of the first dark current suppression area is perpendicular to the surface side of the semiconductor substrate and coterminous with the first end surface of the electric charge storage area,
forming a second dark current suppression area by ion-implanting an impurity of the second conductive type at a second concentration that is higher than the first concentration, wherein the second dark current suppression area at least partially overlaps the electric charge storage area, wherein a first end surface of the second dark current suppression area is perpendicular to the surface side of the semiconductor substrate and coterminous with the first end surface of the first dark current suppression area, wherein the first dark current suppression area is disposed between the electric charge storage area and the second dark current suppression area, and wherein the second dark current suppression area is formed on an outermost surface of the semiconductor substrate in an upper layer of the first dark current suppression area after the transfer gate electrode is formed, and
forming a reading area from which signal electric charge transferred from the photoelectric conversion unit is read after the transfer gate electrode is formed on the surface side of the semiconductor substrate, and wherein the amount of overlap between the first dark current suppression area and the transfer gate electrode is made to be larger on the reading area side than the amount of overlap between the electric charge storage area and the transfer gate electrode.

2. The manufacturing method according to claim 1, wherein the second dark current suppression area is formed by self-alignment by using the transfer gate electrode as a mask.

3. The manufacturing method according to claim 2, further comprising forming a side wall on the side surface of the transfer gate electrode after the transfer gate electrode is formed,
wherein the second dark current suppression area is formed by self-alignment by using the side wall as a mask.

4. A method of manufacturing a solid-state imaging apparatus, comprising:
forming a transfer gate electrode area;
forming a gate insulating film; and
forming a photoelectric conversion unit including
forming an electric charge storage area by ion-implanting an impurity of a first conductive type from a surface side of a semiconductor substrate in a depth direction, wherein the electric charge storage area partially overlaps the transfer gate electrode, wherein a first end surface of the electric charge storage area is perpendicular to the surface side of the semiconductor substrate, and wherein the gate insulating film is disposed between the surface side of the semiconductor substrate and the transfer gate electrode area,
forming a first dark current suppression area by ion-implanting an impurity of a second conductive type at a first concentration, wherein the first dark current suppression area partially overlaps the transfer gate electrode and entirely overlaps the electric charge storage area, and wherein a first end surface of the first dark current suppression area is perpendicular to the surface side of the semiconductor substrate and coterminous with the first end surface of the electric charge storage area, and
forming a second dark current suppression area by ion-implanting an impurity of the second conductive type at a second concentration that is higher than the first concentration, wherein the second dark current suppression area at least partially overlaps the electric charge storage area, wherein a first end surface of the second dark current suppression area is perpendicular to the surface side of the semiconductor substrate and coterminous with the first end surface of the first dark current suppression area, and wherein the first dark current suppression area is disposed between the electric charge storage area and the second dark current suppression area, wherein the second dark current suppression area is formed on an outermost surface of the semiconductor substrate in an upper layer of the first dark current suppression area after the transfer gate electrode is formed; and forming a reading area from which signal electric charge transferred from the photoelectric conversion unit is read after the transfer gate electrode is formed on the surface side of the semiconductor substrate, and wherein the amount of overlap between the first dark current suppression area and the transfer gate electrode is made to be larger on the reading area side than the amount of overlap between the electric charge storage area and the transfer gate electrode.

5. The manufacturing method according to claim 4, wherein the second dark current suppression area is formed by self-alignment by using the transfer gate electrode as a mask.

6. The manufacturing method according to claim 5, further comprising forming a side wall on the side surface of the transfer gate electrode after the transfer gate electrode is formed, wherein the second dark current suppression area is formed by self-alignment by using the side wall as a mask.

* * * * *